US009019320B2

(12) United States Patent
Yamazaki et al.

(10) Patent No.: US 9,019,320 B2
(45) Date of Patent: Apr. 28, 2015

(54) LIQUID CRYSTAL DISPLAY DEVICE AND ELECTRONIC APPLIANCE

(75) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 216 days.

(21) Appl. No.: 13/094,378

(22) Filed: Apr. 26, 2011

(65) Prior Publication Data

US 2011/0267381 A1    Nov. 3, 2011

(30) Foreign Application Priority Data

Apr. 28, 2010    (JP) ................. 2010-104032

(51) Int. Cl.
*G09G 5/10*    (2006.01)
*G09G 3/34*    (2006.01)
(Continued)

(52) U.S. Cl.
CPC .............. *G09G 3/3413* (2013.01); *G09G 3/006* (2013.01); *G09G 3/3426* (2013.01); *G09G 3/3607* (2013.01); *G09G 2300/0452* (2013.01); *G09G 2320/0261* (2013.01); *G09G 2320/062* (2013.01); *G09G 2320/0646* (2013.01); *G09G 2320/066* (2013.01); *G09G 2320/0666* (2013.01); *G09G 2320/103* (2013.01); *G09G 2330/021* (2013.01); *G09G 2340/06* (2013.01); *G09G 2360/16* (2013.01); *G09G 2380/14* (2013.01); *H01L 27/12* (2013.01); *H01L 27/1225* (2013.01); *G02F 1/133603* (2013.01)

(58) Field of Classification Search
USPC .................... 345/690–694, 102, 87
See application file for complete search history.

(56) References Cited

U.S. PATENT DOCUMENTS 5,534,884 A    7/1996    Mase et al.
5,731,856 A    3/1998    Kim et al.
(Continued)

FOREIGN PATENT DOCUMENTS

CN    1343346 A    4/2002
CN    1638587 A    7/2005
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Sahlu Okebato
(74) *Attorney, Agent, or Firm* — Fish & Richadson P.C.

(57) ABSTRACT

An object is to provide a display device that achieves low power consumption and an improved quality of moving and still images. A display device comprises: a display panel provided with a plurality of pixels each including sub-pixels with color filters of red, green, and blue, and a sub-pixel for controlling a transmission of white light; a backlight area including light sources of red, green, blue, and white; an image switch circuit that switches the display panel between a moving image mode and a still image mode; and a display control circuit that controls in the moving image mode a luminance of the light sources of red, green, and blue included in the backlight area, and controls in the still image mode a luminance of a light source of white included in the backlight area.

22 Claims, 20 Drawing Sheets

(51) Int. Cl.
*G09G 3/36* (2006.01)
*H01L 27/12* (2006.01)
*G09G 3/00* (2006.01)
*G02F 1/1335* (2006.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,552,711 B1 | 4/2003 | Nakamura |
| 6,563,174 B2 | 5/2003 | Kawasaki et al. |
| 6,727,522 B1 | 4/2004 | Kawasaki et al. |
| 6,795,066 B2 | 9/2004 | Tanaka et al. |
| 6,825,834 B2 | 11/2004 | Miyajima |
| 6,954,191 B1 | 10/2005 | Hirano |
| 6,958,744 B2 * | 10/2005 | Nakamura ............... 345/98 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,212,185 B2 | 5/2007 | Yanagi et al. |
| 7,282,782 B2 | 10/2007 | Hoffman et al. |
| 7,286,108 B2 | 10/2007 | Tsuda et al. |
| 7,297,977 B2 | 11/2007 | Hoffman et al. |
| 7,317,438 B2 | 1/2008 | Yamazaki et al. |
| 7,321,353 B2 | 1/2008 | Tsuda et al. |
| 7,323,356 B2 | 1/2008 | Hosono et al. |
| 7,333,165 B2 * | 2/2008 | Nakano et al. ............ 349/68 |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,530,722 B2 | 5/2009 | Murai |
| 7,674,650 B2 | 3/2010 | Akimoto et al. |
| 7,724,247 B2 | 5/2010 | Yamazaki et al. |
| 7,732,819 B2 | 6/2010 | Akimoto et al. |
| 7,773,102 B2 | 8/2010 | Lee |
| 7,782,283 B2 | 8/2010 | Hong et al. |
| 7,924,276 B2 | 4/2011 | Tsuda et al. |
| 7,989,274 B2 * | 8/2011 | Kang et al. ............... 438/149 |
| 8,217,877 B2 | 7/2012 | Fukutome |
| 8,232,944 B2 | 7/2012 | Takada et al. |
| 8,314,761 B2 | 11/2012 | Takada et al. |
| 2001/0043179 A1 | 11/2001 | Yoshinaga et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0146492 A1 | 7/2005 | Baba et al. |
| 2005/0146532 A1 * | 7/2005 | Miyazaki et al. ........... 345/600 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0279366 A1 | 12/2007 | Kageyama et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0165102 A1 * | 7/2008 | Tsai et al. ............ 345/88 |
| 2008/0165103 A1 | 7/2008 | Lee |
| 2008/0165204 A1 * | 7/2008 | Klompenhouwer et al. . 345/589 |
| 2008/0166834 A1 | 7/2008 | Kim et al. |
| 2008/0181580 A1 | 7/2008 | Sakai et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296506 A1 | 12/2008 | Ryu et al. |
| 2009/0058842 A1 * | 3/2009 | Bull et al. ............ 345/212 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256795 A1 | 10/2009 | Naum et al. |
| 2009/0267963 A1 * | 10/2009 | Kawashima et al. ......... 345/690 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0253711 A1 | 10/2010 | Muroi |
| 2010/0259569 A1 | 10/2010 | Inuzuka |

FOREIGN PATENT DOCUMENTS

| | | |
|---|---|---|
| CN | 101083063 A | 12/2007 |
| CN | 101126764 A | 8/2008 |
| EP | 1 147 509 A1 | 5/2001 |
| EP | 1296174 A | 3/2003 |
| EP | 1 551 002 A2 | 7/2005 |
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |

(56) References Cited

FOREIGN PATENT DOCUMENTS

| | | |
|---|---|---|
| JP | 2000-044236 A | 2/2000 |
| JP | 2000-150900 A | 5/2000 |
| JP | 2001-108961 A | 4/2001 |
| JP | 2001-154636 A | 6/2001 |
| JP | 2001-210122 A | 8/2001 |
| JP | 2001-281622 A | 10/2001 |
| JP | 2001-312253 A | 11/2001 |
| JP | 2002-076356 A | 3/2002 |
| JP | 2002-149116 A | 5/2002 |
| JP | 2002-278523 A | 9/2002 |
| JP | 2002-289859 A | 10/2002 |
| JP | 2003-086000 A | 3/2003 |
| JP | 2003-086808 A | 3/2003 |
| JP | 2003-248463 A | 9/2003 |
| JP | 2004-103957 A | 4/2004 |
| JP | 2004-273614 A | 9/2004 |
| JP | 2004-273732 A | 9/2004 |
| JP | 2005-195734 A | 7/2005 |
| JP | 2007-114274 A | 5/2007 |
| JP | 2007-322649 A | 12/2007 |
| JP | 2008-187470 A | 8/2008 |
| JP | 2009-116324 A | 5/2009 |
| JP | 2009-192887 A | 8/2009 |
| JP | 2010-021039 A | 1/2010 |
| KR | 2005-0072046 A | 7/2005 |
| WO | 2001/037251 A1 | 5/2001 |
| WO | 2004/114391 A1 | 12/2004 |
| WO | 2009/047950 A1 | 4/2009 |
| WO | WO-2009/051050 | 4/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Paper, Jul. 1, 2009, pp. 41-44.

Hayashi, R et al., "42.1: Invited Paper; Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide bad gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

(56) References Cited

OTHER PUBLICATIONS

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Sized AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO systems at 1350° C," Journal of State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kazuhiko Tsuda et al.; "Ultra low power consumption technologies for mobile TFT-LCDs"; IDW '02 : Proceedings of the 9th International Display Workshops; Dec. 4, 2002; pp. 295-298.

Amano, S et al., "43.4: Low Power LC Display Using In—Ga—Zn—Oxide TFTs Based on Variable Frame Frequency," SID Digest '10 : SID International Symposium Digest of Technical Papers, 2010, pp. 626-629.

International Search Report, PCT Application No. PCT/JP2011/059123, dated Jul. 19, 2011, 5 pages.

Written Opinion, Application No. PCT/JP2011/059123, dated Jul. 19, 2011, 6 pages.

* cited by examiner

LIQUID CRYSTAL DISPLAY DEVICE AND ELECTRONIC APPLIANCE

TECHNICAL FIELD

The present invention relates to a liquid crystal display device, a method for driving a liquid crystal display device, or an electronic appliance including the liquid crystal display device.

BACKGROUND ART

Liquid crystal display devices are widely used in large displays such as television sets and small displays such as cell phones. Higher value-added devices will now be required and their development is moving forward. In recent years, attention is attracted to the development of low power consumption liquid crystal display devices, in terms of the increase in interest in global environment and improvement in convenience of mobile devices.

Non-Patent Document 1 discloses a structure in which the refresh rate needed to display a moving image is differentiated from the refresh rate needed to display a still image in order to reduce the power consumption of a liquid crystal display device.

REFERENCE

Non-Patent Document

Non-Patent Document 1: Kazuhiko Tsuda et al., IDW'02, pp. 295-298

DISCLOSURE OF INVENTION

According to Non-Patent Document 1, low power consumption can be achieved by reducing the refresh rate needed to display a still image. There however is room for improvement in the display quality of a moving image and still image.

In view of this, an object of one embodiment of the present invention is to provide a liquid crystal display device that achieves low power consumption and an improved display quality of a moving image and still image.

According to one embodiment of the present invention, a liquid crystal display device includes: a display panel provided with a plurality of pixels each including a sub-pixel with a red color filter, a sub-pixel with a green color filter, a sub-pixel with a blue color filter, and a sub-pixel for controlling a transmission of white light; a backlight area including light sources of red, green, blue, and white; an image switch circuit that switches the display panel between a moving image mode and a still image mode; and a display control circuit that controls in the moving image mode a luminance of the light sources of red, green, and blue included in the backlight area in accordance with an image signal, and controls in the still image mode a luminance of a light source of white included in the backlight area in accordance with the image signal.

According to one embodiment of the present invention, a liquid crystal display device includes: a display panel provided with a plurality of pixels each including a sub-pixel with a red color filter, a sub-pixel with a green color filter, a sub-pixel with a blue color filter, and a sub-pixel for controlling a transmission of white light; a backlight area including light sources of red, green, blue, and white; an image switch circuit that switches the display panel between a moving image mode and a still image mode; and a display control circuit, the display control circuit including: an image signal converter circuit used to convert a first image signal into a second image signal to be supplied to the sub-pixels; a moving-image display control circuit that controls in the moving image mode the display panel and a luminance of the light sources of red, green, and blue included in the backlight area in accordance with the second image signal; and a still image display control circuit that controls in the still image mode the display panel and a luminance of the light sources of white in accordance with the second image signal.

According to one embodiment of the present invention, a liquid crystal display device includes: a display panel provided with a plurality of pixels each including a sub-pixel with a red color filter, a sub-pixel with a green color filter, a sub-pixel with a blue color filter, and a sub-pixel for controlling a transmission of white light; a backlight area including light sources of red, green, blue, and white; an image switch circuit that switches the display panel between a moving image mode and a still image mode; and a display control circuit, the display control circuit including: an image signal converter circuit used to convert a first image signal into a second image signal to be supplied to the sub-pixels; a moving image timing signal generator circuit that controls the display panel so that the display panel can display an image based on the second image signal in the moving image mode by using a plurality of write periods; a moving-image backlight control circuit that controls in the moving image mode a luminance of the light sources of red, green, and blue included in the backlight area in accordance with the second image signal; a still image timing signal generator circuit that controls the display panel so that the display panel can display an image based on the second image signal in the still image mode by using a plurality of write periods and holding periods; and a still image back light control circuit that controls in the still image mode a luminance of the light sources of white included in the backlight area in accordance with the second image signal.

According to one embodiment of the present invention, a liquid crystal display device includes: a display panel provided with a plurality of pixels each including a sub-pixel with a red color filter, a sub-pixel with a green color filter, a sub-pixel with a blue color filter, a sub-pixel with a yellow color filter, and a sub-pixel for controlling a transmission of white light; a backlight area including light sources of red, green, blue, and yellow; an image switch circuit that switches the display panel between a moving image mode and a still image mode; and a display control circuit, the display control circuit including: an image signal converter circuit used to convert a first image signal into a second image signal to be supplied to the sub-pixels; a moving image timing signal generator circuit that controls the display panel so that the display panel can display an image based on the second image signal in the moving image mode by using a plurality of write periods; a moving-image backlight control circuit that controls in the moving image mode a luminance of the light sources of red, green, and blue included in the backlight area in accordance with the second image signal; a still image timing signal generator circuit that controls the display panel so that the display panel can display an image based on the second image signal in the still image mode by using a plurality of write periods and holding periods; and a still image back light control circuit that controls in the still image mode a luminance of the light sources of blue and yellow included in the backlight area in accordance with the second image signal.

According to one embodiment of the present invention, the holding period may last for one minute or more.

According to one embodiment of the present invention, the sub-pixels may each include a transistor having an oxide semiconductor layer.

According to one embodiment of the present invention, the light sources in the backlight area may be light-emitting diodes.

According to one embodiment of the present invention, it is possible to achieve low power consumption and an improved display quality of a moving image and still image.

BEST MODE FOR CARRYING OUT THE INVENTION

Figure 1A:
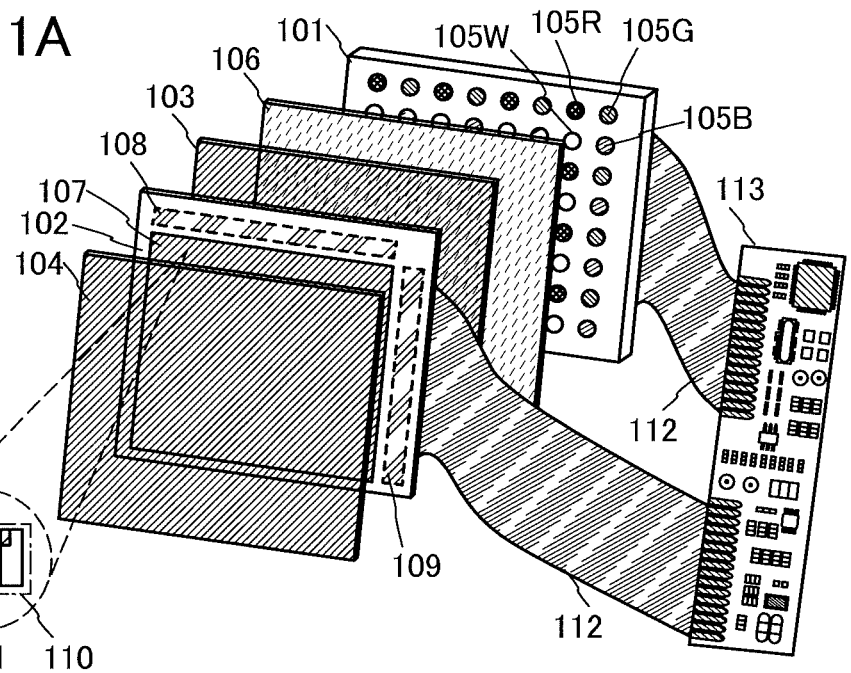
FIGS. 1A and 1B are schematic diagrams showing one embodiment of the present invention.

Embodiments and an example of the present invention will be hereinafter described with reference to the accompanying drawings. Note that the present invention can be carried out in many different modes and it will be readily appreciated by those skilled in the art that modes and details of the present invention can be modified in various ways without departing from the spirit and scope of the present invention. Therefore, the present invention should not be interpreted as being limited to the description of the embodiments and example below. Note that, in the structure of the present invention described below, identical objects in all the drawings are denoted by the same reference numeral.

Note that the size, the thickness of a layer, the signal waveform, or the region of each structure shown in drawings or the like of the embodiments and example is exaggerated for simplicity in some cases. Therefore, the embodiments and example are not limited to such scales.

Note that terms such as first, second, third to Nth (N is a natural number) employed in this specification are used to avoid confusion between components and do not set a limitation on number.

Embodiment 1

A liquid crystal display device of Embodiment 1 that displays an image in a still image mode and a moving image mode will be described below. Note that the still-image mode refers to an operation in which the liquid crystal display device displays a still image on the basis of an image signal input to the liquid crystal display device, and a moving-image mode refers to an operation in which the liquid crystal display device displays a moving image on the basis of an image signal input to the liquid crystal display device.

Note that a moving image is an image that is produced by sequentially displaying at high speed a plurality of images assigned to a plurality of frames on the time series, and thus is recognized by human eyes as a motion image. Specifically, an image produced by sequentially displaying images at least 60 times per second (60 frames) can be recognized by human eyes as a motion image with less flicker. A still image, unlike a moving image, refers to an image based on an image signal that remains unchanged, for example, from an n-th frame to a (n+1)-th frame that belong to a plurality of successive frame periods during which a plurality of images assigned thereto on the time series are sequentially displayed at high speed. Alternatively, a still image refers to a non-moving image such as a photograph or text.

FIG. 1A is a schematic diagram showing part of the internal structure of the liquid crystal display device. The liquid crystal display device shown in FIG. 1A includes a backlight area 101; a display panel 102 in which liquid crystal elements are arranged in a matrix; and a polarizer plate 103 and a polarizer plate 104 between which the display panel 102 is sandwiched. In the backlight area 101, light sources of four colors: red, green, blue, and white (hereinafter referred to as light sources 105R, 105G; 105B, and 105W) are arranged in a matrix; specifically, light-emitting diodes (LEDs) of the four colors: red, green, blue, and white are arranged in a matrix. In addition, a diffuser plate 106 is placed between the display panel 102 and the backlight area 101 in order to bring evenness of light emitted by the backlight area 101.

The luminance of the light sources of four colors in the backlight area 101 is changed when the liquid crystal display device is switched between the still image mode and the moving image mode. Note that the schematic diagram of FIG. 1A shows a scene where light emitted by the backlight area 101 passes through liquid crystal elements in the display panel 102 and is seen by an observer. Note that although in Embodiment 1 the light sources in the backlight are supposed to be light-emitting diodes, they may be another type of light sources as long as the other type of light sources produce light of desired colors. Note that a three-band white light-emitting diode, which is a combination of a light-emitting diode and a fluorescent material, may be used as a light-emitting diode used as a light source of white.

The display panel 102 shown in FIG. 1A includes a pixel area 107, a scan line driver circuit 108 (also referred to as a gate line driver circuit), and a signal line driver circuit 109 (also referred to as a data line driver circuit). Note that the scan line driver circuit 108 and/or the signal line driver circuit 109 may be formed outside the display panel 102. The pixel area 107 in the display panel 102 includes a plurality of pixels. FIG. 1A shows a pixel 110 that is one of the plurality of pixels. The pixel 110 includes a plurality of sub-pixels 111 used to display a color image.

The backlight area 101 and the display panel 102 are electrically connected to each other by an external substrate 113 provided with a display switch circuit, a display control circuit, and the like, and flexible printed circuits (FPCs) 112 serving as external input terminals.

Figure 1B:
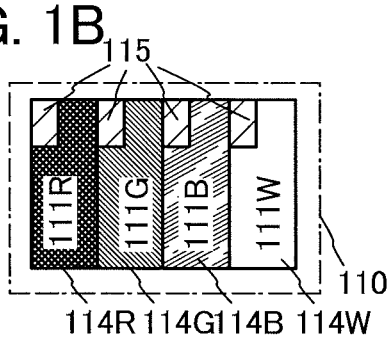

FIG. 1B is an enlarged view of the structure of the pixel 110 shown in FIG. 1A. The pixel 110 includes sub-pixels 111R, 111G, 111B, and 111W used to express four colors: red, green, blue, and white. The sub-pixel 111R includes a light-transmitting area 114R provided with a color filter, and a circuit area 115 including a circuit for selecting the sub-pixel 111R. The sub-pixel 111G includes a light-transmitting area 114G provided with a color filter, and a circuit area 115 including a circuit for selecting the sub-pixel 111G. The sub-pixel 111B includes a light-transmitting area 114B provided with a color filter, and a circuit area 115 including a circuit for selecting the sub-pixel 111B. The sub-pixel 111W includes a light-transmitting area 114W without a color filter, and a circuit area 115 including a circuit for selecting the sub-pixel 111W. In the pixel 110, light transmittance of the sub-pixels 111R, 111G, 111B, and 111W can be individually controlled, allowing a moving image and a still image to be displayed in color by the plurality of pixels 110.

Note that the sub-pixel 111W is formed, unlike the sub-pixels 111R, 111G, and 111B, in order to control transmittance of white light from the backlight area 101. For this reason, the light-transmitting area 114W is not necessarily provided with a color filter. Therefore, in the structure where a white color is produced by light being emitted by the backlight area 101 and passing through the light-transmitting area 114W, a white color used to display a color image can be produced without influence of light attenuation caused when light passes through a color filter. In contrast, in the structure where a white color is produced by an additive process of red (R), green (G), and blue (B), a color filter is provided to all the light-transmitting areas of red (R), green (G), and blue (B), which causes light attenuation. Thus, in the structure where a pixel has a sub-pixel that enables a white color to be produced by light passing through the light-transmitting area 114W without a color filter, the luminance of the backlight area can be reduced when a white color is expressed because it is not affected by light attenuation due to a color filter, thereby achieving the low power consumption of the liquid crystal display device.

Figure 1C:
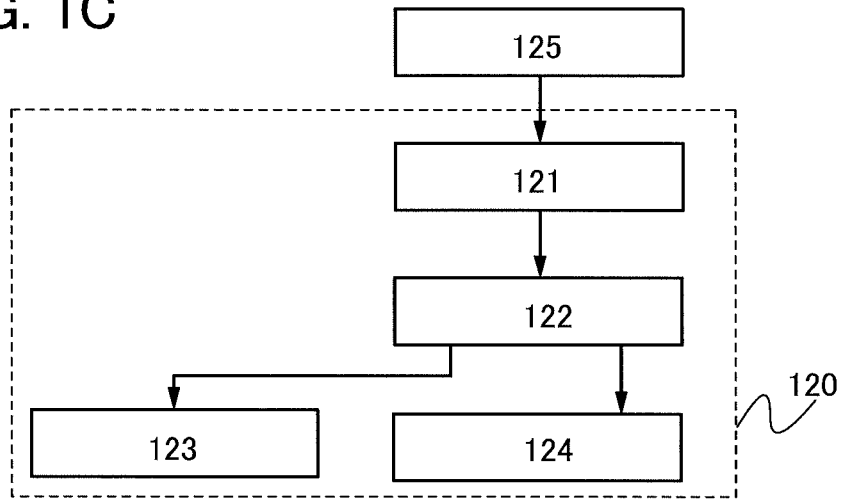
FIG. 1C is a block diagram showing one embodiment of the present invention.

FIG. 1C is a block diagram showing a liquid crystal display device. The liquid crystal display device 120 shown in FIG. 1C includes a display switch circuit 121, a display control circuit 122, a backlight area 123, and a display panel 124.

The display switch circuit 121 is a circuit for switching the liquid crystal display device between a mode in which the display panel 124 displays a moving image (the moving image mode) and a mode in which the display panel 124 displays a still image (the still image mode), in displaying an image based on an image signal from an image signal source 125 (also referred to as a first image signal). For example, the display switch circuit 121 may judge whether an image to be displayed is a moving image or a still image by comparing images in successive frames, and switch the liquid crystal display device between the moving image mode and the still image mode. Alternatively, the display switch circuit 121 may switch the liquid crystal display device between the still image mode and the moving image mode in accordance with the type of an image signal input thereto. For example, the display switch circuit 121 may switch the liquid crystal display device between the still image mode and the moving image mode with reference to the file format of electronic data which is the source of an image signal in the image signal source 125. Alternatively, the display switch circuit 121 may switch the liquid crystal display device between the still image mode and the moving image mode in accordance with a switch signal from other than the display switch circuit 121. For example, the display switch circuit 121 may switch the liquid crystal display device between the still image mode and the moving image mode by using a switching switch.

Note that an image signal from the image signal source 125 is preferably a digital image signal. When it is an analog image signal, an A/D converter is formed between the image signal source 125 and the display switch circuit 121 and the A/D converter converts the image signal from analog to digital.

The display control circuit 122 is a circuit for outputting a signal for controlling the backlight area 123 and the display panel 124 in accordance with the image mode switched by the display switch circuit 121 between the moving image mode and the still image mode. Specifically, the display control circuit 122 is a circuit for controlling, in accordance with the moving image mode or the still image mode, the supply of a signal for controlling the luminance of the light sources in the backlight area 123, the supply of an image signal for displaying an image on the display panel 124, and the supply of a signal (a clock signal, a start pulse, or the like) for operating driver circuits.

The backlight area 123 includes a circuit for controlling backlight, and the light sources of red (R), green (G), blue (B), and white (W). The luminance of the light sources of red (R), green (G), blue (B), and white (W) in the backlight area 123 is individually controlled by the display control circuit 122.

The display panel 124 includes a driver circuit and a plurality of pixels. Each pixel includes sub-pixels used to express four colors: red, green, blue, and white. Each sub-pixel includes a transistor serving as a circuit for selecting the sub-pixel; a pixel electrode connected to the transistor; and a capacitor. Note that a liquid crystal element is formed by interposing a liquid crystal layer between the pixel electrode and an electrode pairing with this pixel electrode. Note that a transistor formed in the sub-pixel preferably has an extremely low leakage current and has an oxide semiconductor layer. An oxide semiconductor in which carriers are reduced to an extreme extent enables the off-state current to be low. Consequently, in the pixel, a holding time of an electric signal such as an image signal can be made longer and the interval of a write period can be set longer.

Figure 2:
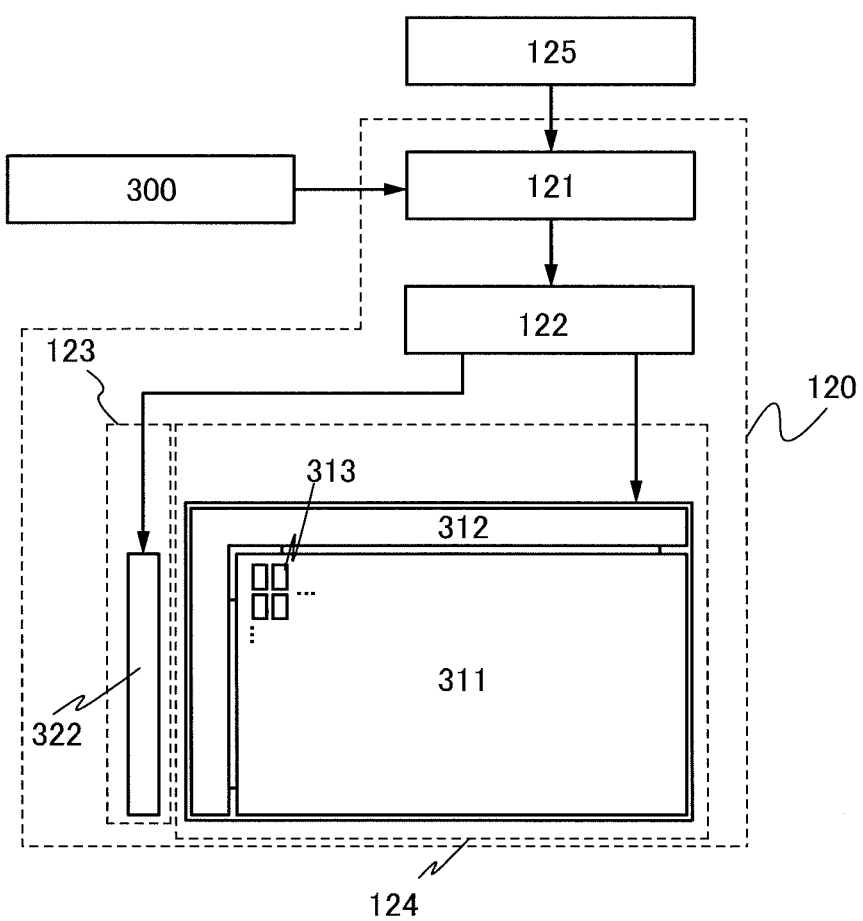
FIG. 2 is a block diagram showing one embodiment of the present invention.

FIG. 2 shows a block diagram of the liquid crystal display device as a specific example of the block diagram of FIG. 1C. FIG. 2 shows, as a specific example of the structure of the display switch circuit 121, a structure in which the liquid crystal display device is switched between the moving image mode and the still image mode by an external switch unit. In addition, FIG. 2 shows the configuration of the backlight area 123 and the display panel 124 shown in FIG. 1C in a more specific manner.

The liquid crystal display device includes, as that shown in FIG. 1C, the display switch circuit 121, the display control circuit 122, the backlight area 123, and the display panel 124.

A signal is input to the display switch circuit 121 from an external switch unit 300. FIG. 2 shows a scene where an image signal is input to the display switch circuit 121 from the image signal source 125. Note that specific examples of the external switch unit 300 are one that mechanically switches the liquid crystal display device like a switching switch; and one that switches the liquid crystal display device with the help of a touch sensor, a keyboard, or the like.

The backlight area 123 shown in FIG. 2 includes a backlight 322. The light sources of red, green, blue, and white (abbreviated to RGBW) are arranged in the backlight 322. Note that although the backlight 322 in FIG. 2 is side by side with the display panel 124, the backlight 322 overlaps with the display panel 124 in practice.

The display panel 124 includes a pixel area 311 and a driver circuit 312. In the pixel area 311, a plurality of sub-pixels 313 used to express RGBW and connected to scan lines and signal lines are arranged in a matrix. Each sub-pixel 313 includes a transistor serving as a circuit for selecting the sub-pixel; a pixel electrode connected to the transistor; and a capacitor. Note that a liquid crystal element is formed by interposing a liquid crystal layer between the pixel electrode and an electrode pairing with this pixel electrode.

An example of the liquid crystal element is an element that controls transmission and non-transmission of light by optical modulation action of liquid crystals. The element can include a pair of electrodes and liquid crystals. Note that the optical modulation action of liquid crystals is controlled by an electric field applied to the liquid crystals.

Note that the display control circuit 122 shown in FIG. 2 outputs a signal for controlling the light sources in the backlight 322 in the backlight area 123; and a signal for controlling the driver circuit 312 in the display panel 124, in response to a signal and an image signal supplied by the display switch circuit 121 and generated according to the judgment whether the display panel 124 displays an image in the moving image mode or the still image mode.

Next, the structure of the display switch circuit 121 which is different from that shown in FIG. 2 will be described with reference to FIG. 3. The display switch circuit 121 shown in FIG. 3 judges whether an image to be displayed is a moving image or a still image by comparing images in successive frames, and switch the liquid crystal display device between the moving image mode and the still image mode.

Figure 3:
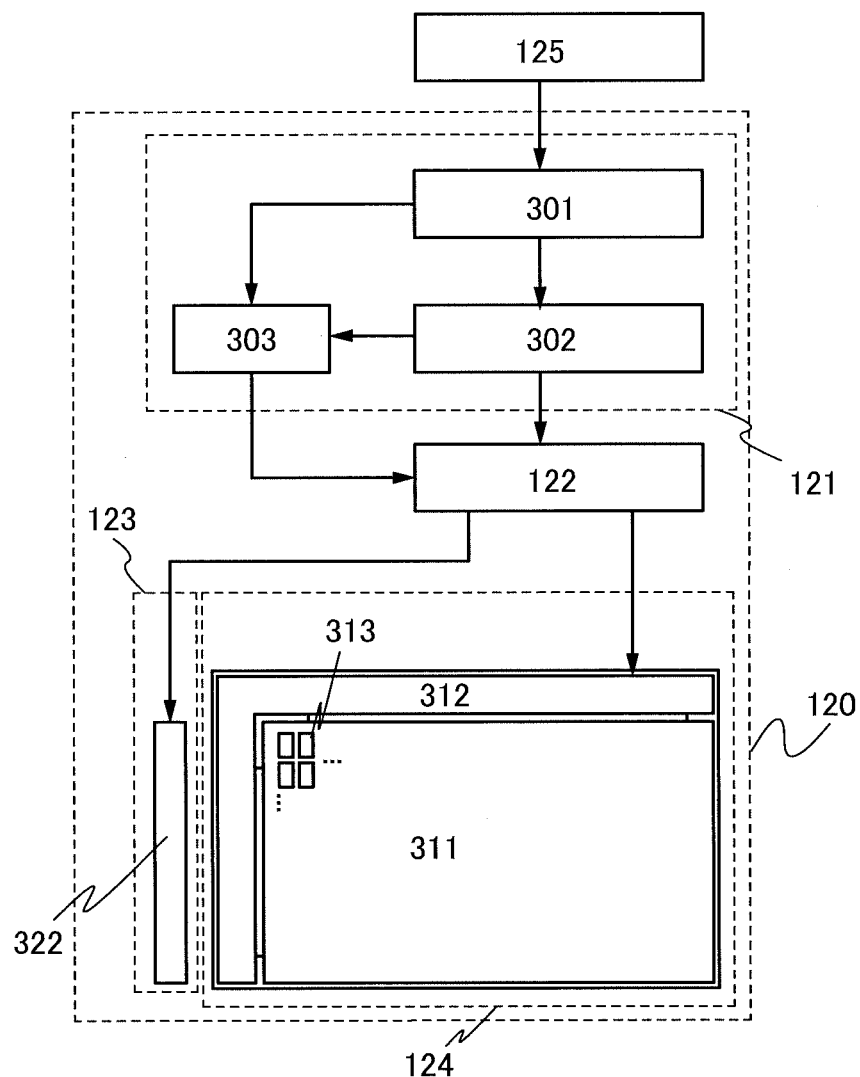
FIG. 3 is a block diagram showing one embodiment of the present invention.

The display switch circuit 121 shown in FIG. 3 includes a memory circuit 301, a comparator circuit 302, and a selection circuit 303.

The operation of the display switch circuit 121 shown in FIG. 3 will be described below.

An image signal is input by the image signal source 125 to the memory circuit 301 in the display switch circuit 121. The memory circuit 301 includes a plurality of frame memories in which image signals in a plurality of frames are stored. The number of frame memories included in the memory circuit 301 is not particularly limited as long as the frame memories are elements capable of storing the image signals in a plurality of frames. Note that the frame memory may be a memory element such as dynamic random access memory (DRAM) or static random access memory (SRAM).

The number of frame memories is not particularly limited as long as the frame memories store image signals every frame period. In addition, image signals stored in the frame memories are selectively read by the comparator circuit 302 and the selection circuit 303.

The comparator circuit 302 selectively reads image signals in a successive frame periods stored in the memory circuit 301 and compares the image signals in the successive frames pixel by pixel, thereby detecting a difference therebetween.

The operation of the display control circuit 122 and the selection circuit 303 depends on the existence of such a difference. A comparison of image signals performed by the comparator circuit 302 judges, when a difference is detected from any of the pixels, successive frame periods in which this difference exists as a moving image. In contrast, a comparison of image signals performed by the comparator circuit 302 judges, when no difference is detected from any of the pixels, corresponding successive frame periods as a still image. In other words, the comparator circuit 302 judges whether the image signals are used to display a moving image or a still image by detecting a difference in image signals in successive frame periods.

A difference detected by the comparison which exceeds a predetermined level may be judged to have been detected. The comparator circuit 302 is set to judge whether a difference has been detected, from the absolute value of the difference regardless of the magnitude of the difference.

The selection circuit 303 includes a plurality of switches, for example, a plurality of switches using transistors. When a difference is detected by a difference calculation performed by the comparator circuit 302, that is, when images displayed in successive frame periods are a moving image, the selection circuit 303 selects the image signals in the frame memories included in the memory circuit 301 and outputs the image signals to the display control circuit 122.

Note that when a difference between image signals is not detected by a difference calculation performed by the comparator circuit 302, that is, when images displayed in successive frame periods are a still image, the selection circuit 303 does not output the image signals to the display control circuit 122. Thus, when the image signals are a still image, an operation in which the selection circuit 303 does not output the image signals stored in the frame memories included in the memory circuit 301 to the display control circuit 122 can be stopped, resulting in a reduction in power consumption.

Figure 4:
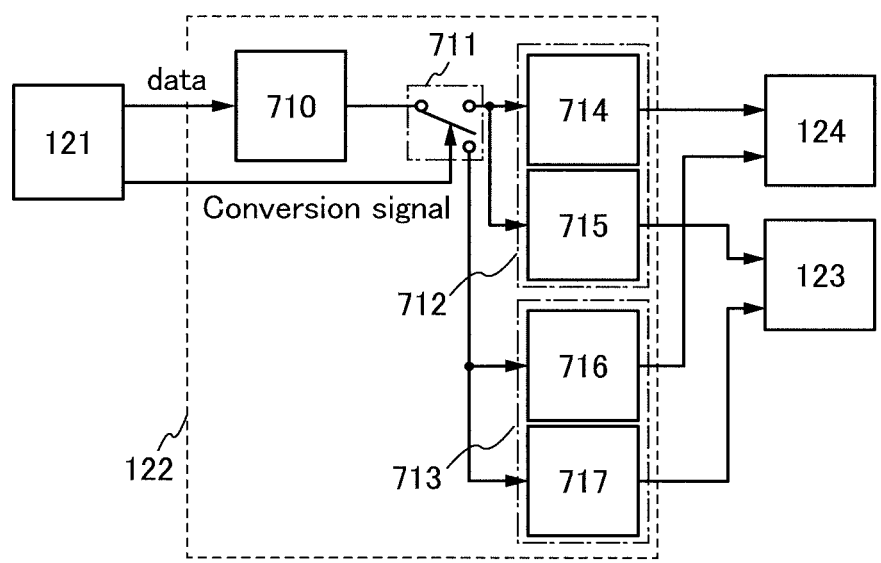
FIG. 4 is a block diagram showing one embodiment of the present invention.

Next, a structure of the display control circuit 122 will be described with reference to FIG. 4. FIG. 4 is a block diagram showing an example of the display control circuit 122 for switching and outputting a signal for controlling the backlight area 123 and the display panel 124 in accordance with the image mode switched by the display switch circuit 121 between the moving image mode and the still image mode. Specifically, the display control circuit 122 includes an image signal converter circuit 710, a display control switch circuit 711, a moving image display control circuit 712, and a still image display control circuit 713. The moving image display control circuit 712 includes a moving image timing signal generator circuit 714 and a moving image backlight control circuit 715. The still image display control circuit 713 includes a still image timing signal generator circuit 716 and a still image backlight control circuit 717.

The image signal converter circuit 710 is used to convert an image signal "data" by arithmetic processing to a second image signal that corresponds to the sub-pixels 111R, 111G, 111B, and 111W used to express RGBW, in the case where the image signal "data" from the display switch circuit 121 is a first image signal that do not correspond to the sub-pixels 111R, 111G, 111B, and 111W used to express RGBW, for example, in the case where the image signal "data" is an image signal for displaying a color image consisting of three colors: R (red), G (green), and B (blue). As a specific example, the image signal converter circuit 710 generates a new white image signal dealt by the sub-pixel 111W by subtracting a grayscale value of an image signal used to express a white image dealt by the sub-pixel 111W from a grayscale value of an image signal used to express a color image consisting of three colors: R (red), G (green), and B (blue), and converts, with the help of the sub-pixels 111R, 111G, 111B, and 111W used to express RGBW, the image signal "data" to an image signal used to express a color image which equals that used to express a color image consisting of three colors: R (red), G (green), and B (blue).

The display control switch circuit 711 is used to determine to which control circuit (the moving image display control circuit 712 or the still image display control circuit 713) an image signal of RGBW produced by a conversion that has been made by the image signal converter 710 is input, in accordance with a signal that is supplied from the display switch circuit 121 and is used to switch the liquid crystal display device between the moving image mode and the still image mode (such a signal is referred to as a switch signal). Specifically, a transistor or the like is used as a switching element.

The moving image timing signal generator circuit 714 is used to control the supply of an image signal that allows the display panel 124 to display an image in the moving image mode; and the supply of a signal (a clock signal, a start pulse, or the like) that allows the driver circuit in the display panel 124 to operate. The moving image backlight control circuit 715 is used to control the luminance of the light sources of R (red), G (green), and B (blue) in the backlight area, in response to an image signal that allows the display panel 124 to display an image in the moving image mode.

The still image timing signal generator circuit 716 is used to control the supply of an image signal that allows the display panel 124 to display an image with the still image mode; and the supply of a signal (a clock signal, a start pulse, or the like) that allows the driver circuit in the display panel 124 to operate. The still image backlight control circuit 717 is used to control the luminance of the light source of white (W) in the backlight area, in response to an image signal that allows the display panel 124 to display an image with the still image mode.

Next, a control of the display panel 124 performed in the moving image mode and the still image mode by the moving image timing signal generator circuit 714 and the still image timing signal generator circuit 716 will be described. A period during which an image is displayed in the moving image mode is hereinafter referred to as a moving image display period, and a period during which an image is displayed with the still image mode is hereinafter referred to as a still image display period. Note that a moving image display period is a period in which a sequence of periods each used to display one still image produces a moving image. Specifically, a moving image display period is a period in which the image is changed 60 times or more per second (60 frames) to display a moving image. In contrast, a still image display period has a single or plurality of periods each used to display one still image to display a still image. An image signal is written at a uniform refresh rate in the still image display period. Note that one frame period means a period during which an image displayed by sequentially writing image signals to a plurality of pixels in a display panel is renewed.

Figure 5A:
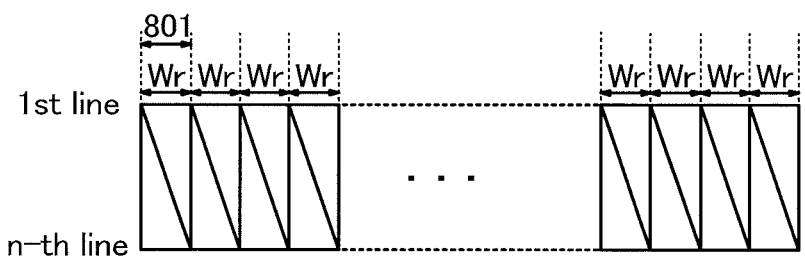
FIGS. 5A and 5B are timing diagrams showing one embodiment of the present invention.

A period 801 shown in FIG. 5A is one frame period of the moving image display period. The period 801 includes write periods (denoted by "Wr" in FIG. 5A). Note that the moving image display period may include a holding period in addition to the write periods but the holding period is preferably short such that flickers do not occur. In the write period, an image signal is sequentially input to the first to n-th rows of pixels in a display panel. In the write period, different image signals are input to pixels in a sequence of frame periods, so that a viewer perceives a moving image. Specifically, in Wr, a write period in which an image signal is written included in the moving image display period, a write speed is preferably 16.6 milliseconds or less at which flickers do not occur.

Figure 5B:
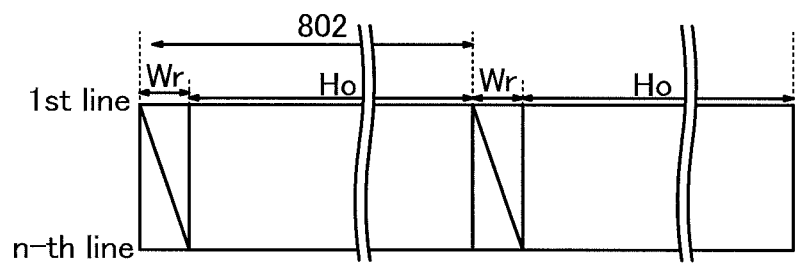

A period 802 shown in FIG. 5B is one frame period included in the still image display period. The period 802 includes a write period (denoted by "Wr" in FIG. 5B) in which an image signal is input to a pixel; and a holding period (denoted by "Ho" in FIG. 5B) in which an image signal is held in the pixel. In the write period, an image signal is sequentially written to the first to n-th rows of pixels in a display panel. The written image signal holds a voltage applied to a liquid crystal element by turning off the transistor in the holding period. That is to say, in the holding period, an image signal is held by utilizing the fact that a voltage drop due to a leakage current of the transistor is extremely small. In a holding period of an image signal which is included in the still image display period 802, a drop in a voltage applied to the liquid crystal element is preferably small such that a reduction in display quality is not caused by passage of retention time. Making a holding period of an image signal last for one minute or more also reduces human eye fatigue. In the case where a voltage applied to the liquid crystal element drops because of passage of retention time, a write period in which an image signal is written that is the same as that in the previous period is placed again, and a holding period is thus placed again.

Note that a transistor formed in the sub-pixel preferably has an extremely low leakage current and has an oxide semiconductor layer. An oxide semiconductor in which carriers are reduced to an extreme extent enables the off-state current to be low. Consequently, in the pixel, a holding time of an electric signal such as an image signal can be made longer and the interval of a write period can be set longer. The transistor may be an inverted-staggered transistor or a staggered transistor. Alternatively, the transistor may be a double-gate transistor in which a channel region is divided into a plurality of regions and the divided channel regions are connected in series. Alternatively, the transistor may be a dual-gate transistor in which gate electrodes are provided over and below the channel region. Alternatively, the transistor may be a transistor capable of switching operation in which a semiconductor layer into a plurality of island-shaped semiconductor layers.

Next, a control of the display panel 124 exercised with the moving image mode and the still image mode by the moving image timing signal generator circuit 714 and the still image timing signal generator circuit 716 will be described with reference to a timing diagram of each signal. A timing diagram of the period 801 and a timing diagram of the period 802 that have been described with reference to FIG. 5A are FIG. 6A and FIG. 6B, respectively.

Figure 6A:
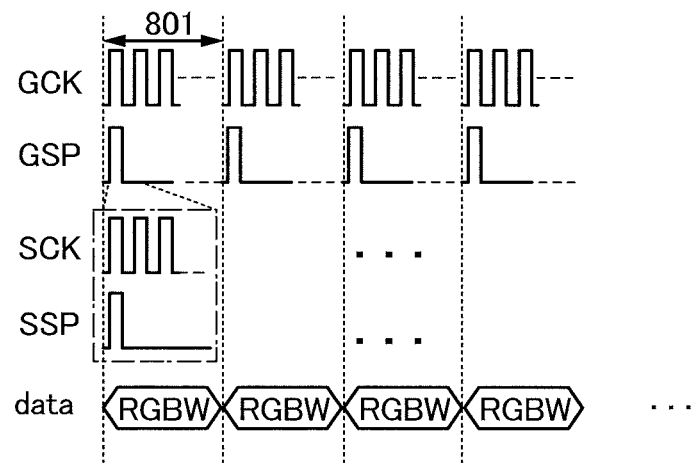
FIGS. 6A and 6B are timing diagrams showing one embodiment of the present invention.

FIG. 6A shows, on a period 801 basis, a clock signal GCK and start pulses GSP which are supplied to the scan line driver circuit; and a clock signal SCK, a start pulse SSP, the image signal "data" which are supplied to the signal line driver circuit.

In the display period 801, the clock signal GCK is a clock signal which is constantly supplied. The start pulse GSP is a pulse made in accordance with a vertical synchronization frequency. The clock signal SCK is a clock signal constantly supplied. The start pulse SSP is a pulse for one gate selection period. Note that writing of an image signal of R (red), G (green), B (blue), and W (white) which corresponds to the sub-pixels in each pixel is performed in the period 801. In addition, the viewer can visually recognize a color image thanks to light of R (red), G (green), and B (blue) from the light sources in the backlight in addition to the writing of an image signal. Further, the viewer is allowed to visually recognize a color moving image by the fact that a plurality of images is sequentially displayed because of the period 801 in which data writing is performed a plurality of times.

Figure 6B:
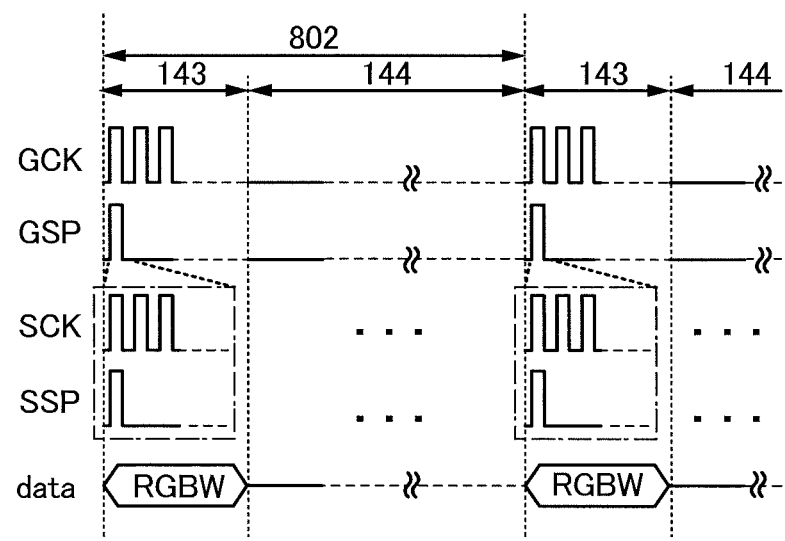

Next, FIG. 6B will be described. FIG. 6B illustrates the period 802 divided into a write period 143 and a holding period 144.

In the write period 143, the clock signal GCK serves as a clock signal for writing one screen. The start pulse GSP serves as a pulse for writing one screen. The clock signal SCK serves as a clock signal for writing one screen. The start pulse SSP serves as a pulse for writing one screen. In the write period 143, the writing of an image signal of R (red), G (green), B (blue), and W (white) which corresponds to the sub-pixels in each pixel is performed.

In the holding period 144, supply of the clock signals GCK, the start pulse GSP, the clock signal SCK, and the start pulse SSP is stopped in order to stop the operation of the signal line driver circuit and the scan line driver circuit. Thus, power consumption can be reduced in the holding period 144. In the holding period 144, image signals that have been input to the pixels in the write period 143 are held by the pixel transistors with extremely low off-state current, allowing a color still image to be held for one minute or more. Note that during that time, the viewer is allowed to visually recognize a color still image by light from the light sources of W (white) in the backlight. Before the potential of the image signal held is reduced by a passage of a predetermined period, another write period 143 is placed to perform the writing of an image signal that is the same as the image signal of the previous period (refresh operation), thereby placing the holding period 144 again.

Next, the control of the backlight area 123 exercised by the moving image backlight control circuit 715 and the still image backlight control circuit 717 in the moving image mode and the still image mode will be described. In the structure of Embodiment 1, switching the on/off of the backlight area by switching the liquid crystal device between the moving image mode and the still image mode further improves the display quality of a moving image and a still image. A specific structure and the effects thereof will be described with reference to FIGS. 7A to 7C and FIGS. 8A to 8C.

Figure 7A:
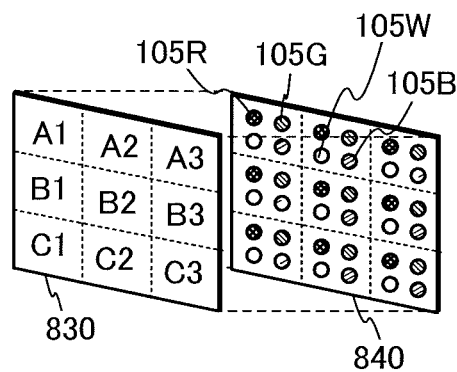
FIGS. 7A to 7C are schematic diagrams used to describe one embodiment of the present invention.

FIG. 7A shows the scene where the pixel area 830 in the display panel is divided into a plurality of regions for convenience. In FIG. 7A, the pixel area 830 is divided into a region A1, a region A2, a region A3, a region B1, a region B2, a region B3, a region C1, a region C2, and a region C3. In addition, FIG. 7A also shows the backlight 840 used for the pixel area 830 having, for example, the structure in which the regions are each assigned to the light sources 105R, 105G, 105B, and 105W of R (red), G (green), B (blue), and W (white).

Figure 7B:
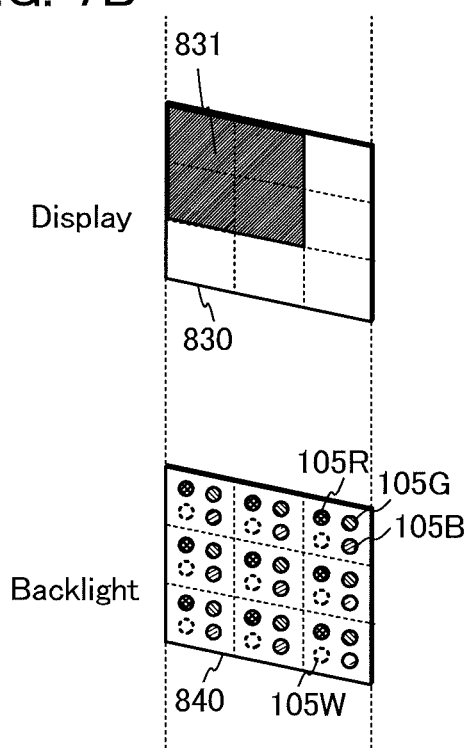

FIG. 7B shows a model image displayed on the pixel area and the on/off of the backlight at the time in order to describe the operation of the moving image backlight control circuit 715 in the moving image mode.

FIG. 7B shows an image displayed on the pixel area 830 and the on/off of the backlight 840 arranged one above the other. A display image 831 displayed on the region A1, the region A2, the region B1, and the region B2 is shown as an example of an image displayed on the pixel area 830.

The moving image backlight control circuit 715 is a circuit for controlling the luminance of the backlight 840 in accordance with an image signal (the second image signal) that corresponds to the sub-pixels of RGBW in the moving image mode. Specifically, in FIG. 7B, the moving image backlight control circuit 715 turns on the light sources 105R, 105G and 105B, and turns off the light sources 105W. Note that in FIG. 7B, the on state of the light sources in the backlight 840 is described with solid lines and the off state is described with dotted lines.

In FIG. 7B showing the case where an image is displayed in the moving image mode, white light is obtained by simultaneously turning on the light sources of R (red), G (green), and B (blue) in the backlight. The use of the light sources of R (red), G (green), and B (blue) in the backlight allows an image with a desired range of color reproduction to be displayed, improving the display quality of a moving image.

Figure 7C:
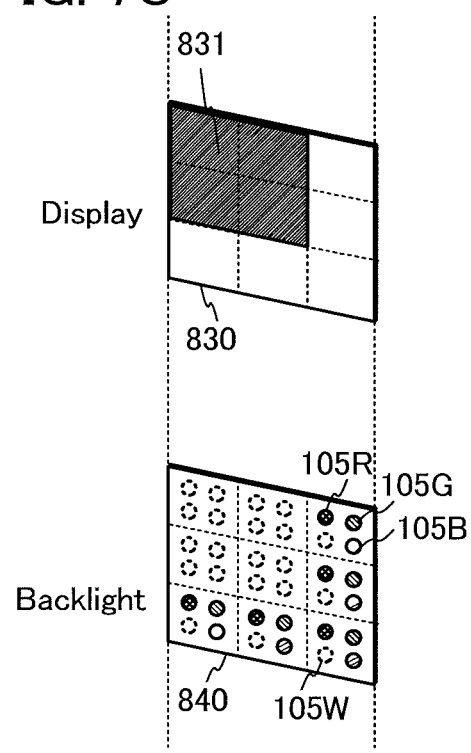

In FIG. 7C, the display image 831 displayed on the region A1, the region A2, the region B1, and the region B2 is shown as an example of the image displayed on the pixel area 830, as in FIG. 7B. An example of the case where local dimming, which is a driving method in which the luminance of the backlight is controlled in accordance with the display image 831, is used will be described with reference to FIG. 7C. Here, the regions displaying the display image 831 are those on which an image with a low (or zero) luminance is displayed, and the other regions are those on which an image with a high luminance is displayed.

The moving image backlight control circuit 715 is a circuit for controlling the luminance of the backlight 840 in accordance with an image signal (a second image signal) that corresponds to the sub-pixels of RGBW in the moving image mode. Specifically, the moving image backlight control circuit 715 calculates and stores a histogram of the frequency of occurence of the grayscale value on an image signal input to the pixel area 830 region by region, and thus calculates the luminance of each region. Note that since the pixel reproduces one color with four sub-pixels with color components of R (red), G (green), B (blue), and W (white), the moving image backlight control circuit 715 calculates the luminance of each region with the combination of four sub-pixels by assigning weights to RGBW. Then, the moving image backlight control circuit 715 outputs a signal for controlling the luminance of backlights used for intended regions in the pixel area 830 to the backlight area 123 in accordance with the luminance of each region in the pixel area 830.

In an example shown in FIG. 7C, the light sources 105R, 105G and 105B are controlled to turn of backlights used for intended regions in the pixel area 830. In addition, the light sources 105R, 105G and 105B are controlled in order for backlights used for regions other than those displaying the display image 831 to emit high-luminance light.

Note that although FIG. 7C has been described on the assumption that the luminance produced by the pixel area comes in two levels of high luminance and low luminance, a structure in which the luminance of the backlight is controlled as appropriate with a plurality of levels is acceptable.

In FIG. 7C showing the case where an image is displayed with the moving image mode, white light is obtained by simultaneously turning on the light sources of R (red), G (green), and B (blue) in the backlight. This allows an image with a desired range of color reproduction to be displayed, improving the display quality of a moving image. In addition, the luminance of the backlight is controlled region by region of the pixel area, so that the contrast of a displayed image can be improved and the display quality of a moving image can be improved.

Figure 8A:
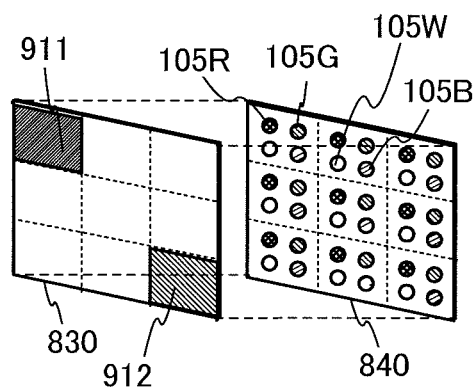
FIGS. 8A to 8C are schematic diagrams used to describe one embodiment of the present invention.
Figure 8B:
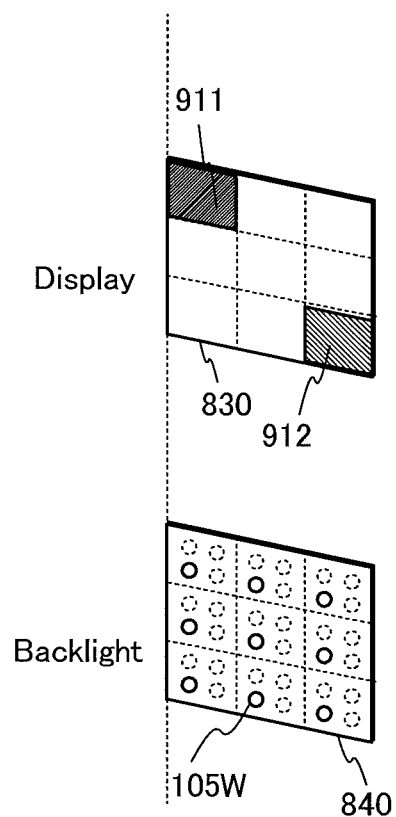
Figure 8C:
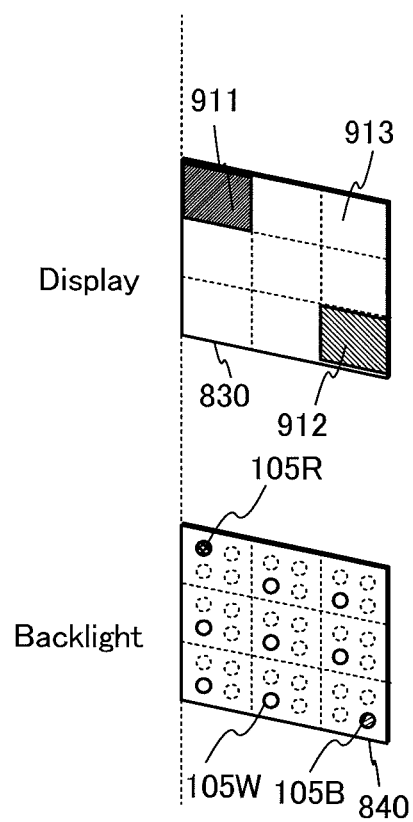

FIGS. 8A to 8C show a model image displayed on the pixel area and the on/off of the backlight at the time in order to describe the operation of the still image backlight control circuit 717 in the still image mode. Note that FIGS. 8A to 8C will be described dividing the region of the pixel area 830 into a plurality of regions, as FIG. 7A.

FIG. 8B shows a model image displayed on the pixel area and the on/off of the backlight at the time in order to describe the operation of the still image backlight control circuit 717 in the still image mode.

FIG. 8B shows an image displayed on the pixel area 830 and the on/off of the backlight 840 arranged one above the other. A display image 911 displayed on the region A1 and a display image 912 displayed on the region C3 are shown as an example of images displayed on the pixel area 830.

The still image backlight control circuit 717 is a circuit for controlling the luminance of the backlight 840 in accordance with an image signal (a second image signal) that corresponds to the sub-pixels of RGBW in the still image mode. Specifically, in FIG. 8B, the still image backlight control circuit 717 turns off the light sources 105R, 105G, and 105B, and turns on the light sources 105W. Note that in FIG. 8B, the on state of the light sources in the backlight 840 is described with solid lines and the off state is described with dotted lines.

In FIG. 8B showing the case where an image is displayed with the still image mode, white light is obtained by turning on the light sources of W (white) in the backlight. The use of the white light sources rather than the use of white light obtained by simultaneously turning on the light sources of R (red), G (green), and B (blue) reduces the light sources to turn on and thus achieves low power consumption.

FIG. 8C shows the display image 911 displayed on the region A1 and the display image 912 displayed on the region C3 as an example of images displayed on the pixel area 830, as FIG. 8B. An example of the case where a driving method in which the luminance of the backlight is controlled in accordance with the display images 911 and 912 is used will be described with reference to FIG. 8C. Here, the operation shown in FIG. 8C will be described on the assumption that, as an example of an image displayed on the pixel area 830, the region A1 displays the display image 911 which is a red image; the region C3 displays the display image 912 which is a blue image; the other regions display a display image 913 which is a white image.

The still image backlight control circuit 717 is a circuit for controlling the luminance of the backlight 840 in accordance with an image signal (a second image signal) that corresponds to the sub-pixels of RGBW in the still image mode. Specifically, in the still image backlight control circuit 717, the red (R) light source 105R belonging to the light sources used for the region A1, the blue (B) light source 105B belonging to the light sources used for the region C3, and the white (W) light source 105W belonging to the light sources used for the other regions are made to turn on. Note that the other light sources are turned off. Thus, in the structure of Embodiment 1, the luminance of the light sources of R (red), G (green), B (blue), and W (white) in the backlight can be selectively controlled region by region of the pixel area, so that an image with a desired color purity can be displayed. In addition, the use of the white light sources or the light sources of a single color leads to low power consumption.

Note that although FIG. 8C has been described without the description of the luminance produced by the pixel area, a structure in which the luminance of the light sources in the backlight is controlled with a plurality of luminance levels is acceptable.

In FIG. 8C showing the case where an image is displayed with the still image mode, white light is obtained by turning on the light sources of W (white) in the backlight, as in FIG. 8B. The use of the white light sources rather than the use of white light obtained by simultaneously turning on the light sources of R (red), G (green), and B (blue) reduces the light sources to turn on and thus achieves low power consumption. In addition, by turning on the light sources of R (red), G (green), and B (blue) in the backlight in accordance with an image displayed on the pixel area, an image with a desired range of color reproduction can be displayed, improving the display quality of a moving image.

As described above, in the case where an image is displayed in the still image mode as shown in FIG. 8C, an image is often displayed with a plurality of grayscale values compared with the case where an image is displayed in the moving image mode. By selectively controlling the luminance of the light sources of R (red), G (green), and B (blue) in the backlight region by region of the pixel area, an image with a desired color purity can be displayed. In addition, in the regions for which white back light is turned on, the use of light sources for reproducing white light, that is, the light sources 105W of white rather than the use of white light obtained by simultaneously turning on the light sources of R (red), G (green), and B (blue), that is, the light sources 105R, 105G, and 105B leads to low power consumption.

The liquid crystal display device of Embodiment 1 achieves low power consumption in displaying a still image, by reducing the write cycles of the image signal. In addition, in displaying a moving image, the liquid crystal display device of Embodiment 1 allows an image with a desired color purity to be displayed by controlling the luminance of the light sources of R (red), G (green), and B (blue) in the backlight and thus improves the display quality. Further, in displaying a still image, the liquid crystal display device of Embodiment 1 can reduce its power consumption used to turn on the light sources of white by controlling the luminance of the light sources in the backlight with the use of the light sources of W (white).

Embodiment 1 can be implemented in appropriate combination with the structures described in the other embodiments.

Embodiment 2

In Embodiment 2, a structure in which the combination of color elements used by the sub-pixels constituting the pixel 110 of Embodiment 1 is not RGBW but one including yellow instead of W will be described. Note that common descriptions between Embodiment 1 and Embodiment 2 will be omitted in Embodiment 2.

Figure 9A:
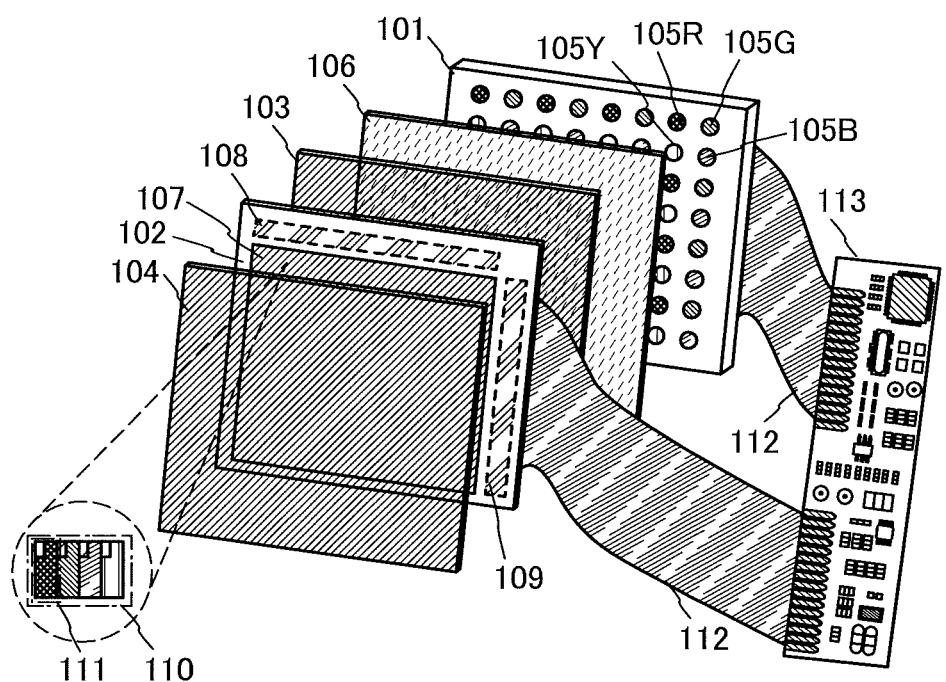
FIGS. 9A and 9B are schematic diagrams used to describe one embodiment of the present invention.

FIG. 9A is a diagram showing a liquid crystal display device as FIG. 1A. FIG. 9A is different from FIG. 1A in that the combination of the light sources in the backlight area 101 is light sources of four colors: red, green, blue, and yellow (hereinafter referred to as light sources 105R, 105G; 105B, and 105Y).

Unlike the structure of Embodiment 1, the structure of Embodiment 2 does not employ the white light sources but employs light-emitting diodes of blue and yellow which are turned on at the same time and thus serve as a white light source. Note that a structure in which blue and its complementary color, yellow, serve as a white light source brings advantages such as low power consumption, compared with a structure in which white is produced by turning on light sources of R (red), G (green), and B (blue) at the same time.

Figure 9B:
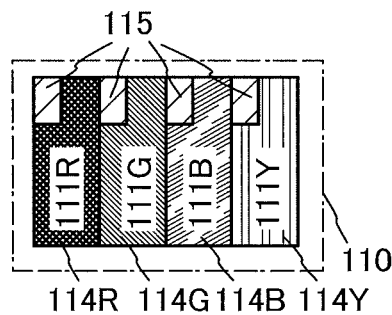

The pixel 110 of Embodiment 2 includes the plurality of sub-pixels 111 used to display a color image. FIG. 9B shows that, unlike the combination of the sub-pixels included in the pixel of Embodiment 1, the combination of the sub-pixels included in the pixel of Embodiment 2 consists of sub-pixels 111R, 111G, 111B, and 111Y for respectively expressing red, green, blue, and yellow.

Note that the sub-pixel 111Y includes a light-transmitting area 114Y. A structure in which light emitted from the light sources 105Y passes through the light-transmitting areas 114Y of the sub-pixels 111Y to produce yellow allows an image with a desired color purity to be displayed. As a result, an image with a desired range of color reproduction can be displayed by the sub-pixels 111R, 111G, 111B, and 111Y for respectively expressing red, green, blue, and yellow. In addition, a structure in which the light source 105B of blue and the light source 105Y of yellow are turned on at the same time to serve as a white light source achieves low power consumption, compared with a structure in which the light sources 105R of R (red), 105G of G (green), and 105B of B (blue) are turned on at the same time to produce white.

Note that Embodiment 2 employs as appropriate the same operations as those of the liquid crystal display device in the block diagram of FIG. 1C; the display switch circuits 121 in FIG. 2 and FIG. 3; the display control circuit 122 in FIG. 4; and the control of the backlight area 123 and the display panel 124 in the moving image mode and the still image mode in FIGS. 5A to 5B, FIGS. 6A and 6B, FIGS. 7A to 7C, and FIGS. 8A to 8C.

Embodiment 2 can be implemented in appropriate combination with the structures described in the other embodiments.

Embodiment 3

In Embodiment 3, an example of the structure of the display panel of Embodiment 1 and an example of the circuit configuration of the sub-pixel of Embodiment 1 will be described.

Figure 10:
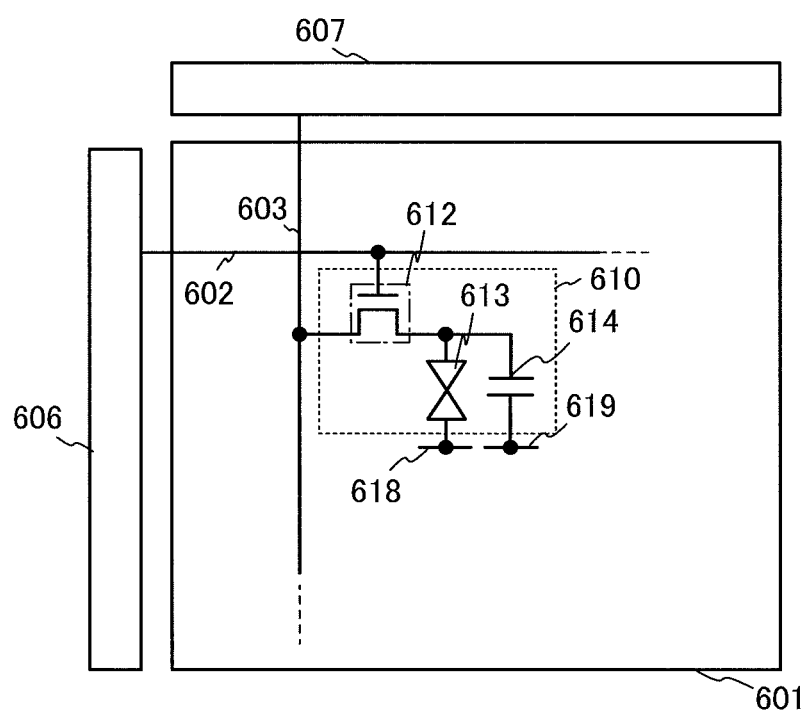
FIG. 10 is a circuit diagram used to describe one embodiment of the present invention.

A display panel shown in FIG. 10 includes a pixel area 601, a scan line 602 (also referred to as a gate line), a signal line 603 (also referred to as a data line), a sub-pixel 610, a common electrode 618 (also referred to as a common electrode), a capacity line 619, a scan line driver circuit 606 serving as a driver circuit, and a signal line driver circuit 607 serving as a driver circuit.

The sub-pixel 610 includes a pixel transistor 612, a liquid crystal element 613, and a capacitor 614. A gate of the pixel transistor 612 is connected to the scan line 602, a first terminal serving as one of a source and a drain of the pixel transistor 612 is connected to the signal line 603, and a second terminal serving as the other of the source and the drain of the pixel transistor 612 is connected to one electrode of the liquid crystal element 613 and a first electrode of the capacitor 614. The other electrode of the liquid crystal element 613 is connected to the common electrode 618. A second electrode of the capacitor 614 is connected to the capacitor line 619. The pixel transistor 612 is preferably formed using a thin film transistor (a TFT) having a thin oxide semiconductor layer.

Note that a thin film transistor is an element having at least three terminals of gate, drain, and source. The thin film transistor includes a channel region between a drain region and a source region, and current can flow through the drain region, the channel region, and the source region. Here, since the source and the drain may change depending on the structure, the operating condition, and the like of the transistor, it is difficult to define which is a source or a drain. Therefore, in this document (the specification, the claims, the drawings, and the like), a region serving as a source and a drain is not called the source or the drain in some cases. In such a case, for example, one of the source and the drain may be referred to as a first terminal and the other may be referred to as a second terminal. Alternatively, one of the source and the drain may be referred to as a first electrode and the other may be referred to as a second electrode. Further alternatively, one of the source and the drain may be referred to as a source region and the other may be referred to as a drain region.

Using an oxide semiconductor for a semiconductor layer of the pixel transistor 612 lowers the off-state current of the transistor. Consequently, in the pixel, a holding time of an electric signal such as an image signal can be made longer and the interval of a write period can be set longer. Therefore, the cycle of one frame period can be made longer, and the frequency of refresh operations performed in the still-image mode can be reduced, thereby further enhancing the effect of suppressing power consumption. A transistor using an oxide semiconductor has a relatively high field-effect mobility compared with a transistor using amorphous silicon, and thus shortens a write time and achieves a high-speed operation.

Note that the scan line driver circuit 606 and the signal line driver circuit 607 are preferably formed over the substrate over which the pixel portion 601 is formed; however, these are not necessarily formed over the substrate over which the pixel portion 601 is formed. Forming the scan line driver circuit 606 and the signal line driver circuit 607 over the substrate over which the pixel portion 601 is formed reduces the number of terminals through which the liquid crystal display device is connected to an external unit and reduces the size of the liquid crystal display device.

Note that the sub-pixels 610 are arranged (aligned) in a matrix. Here, the description that states "pixels are arranged (aligned) in a matrix" is intended for the case where the pixels are arranged directly or zig-zag in the longitudinal direction or lateral direction, and the like.

Note that the description that explicitly states "A and B are connected to each other" is intended for the case where A and B are electrically connected to each other; the case where A and B are functionally connected to each other; the case where A and B are directly connected to each other; and the like.

Embodiment 3 can be implemented in appropriate combination with the structures described in the other embodiments.

Embodiment 4

In Embodiment 4, an example of the plane view and the cross-sectional view of a pixel in the display panel will be described with reference to drawings. Note that in Embodiment 4, the pixel refers to the sub-pixel of Embodiment 1.

Figure 11A:
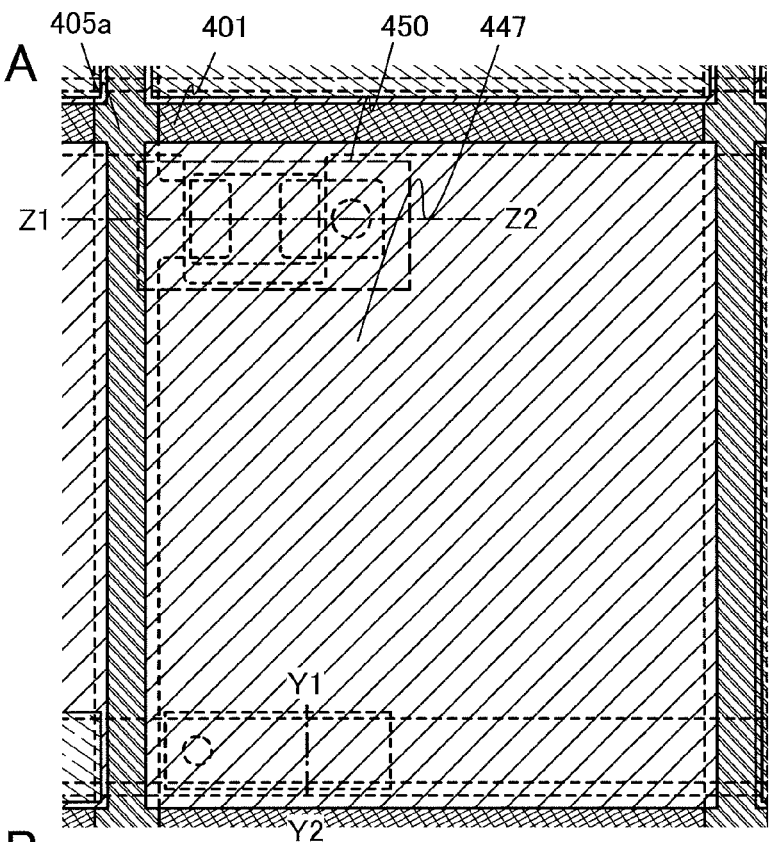
FIG. 11A is a top view used to describe one embodiment of the present invention.
Figure 11B:
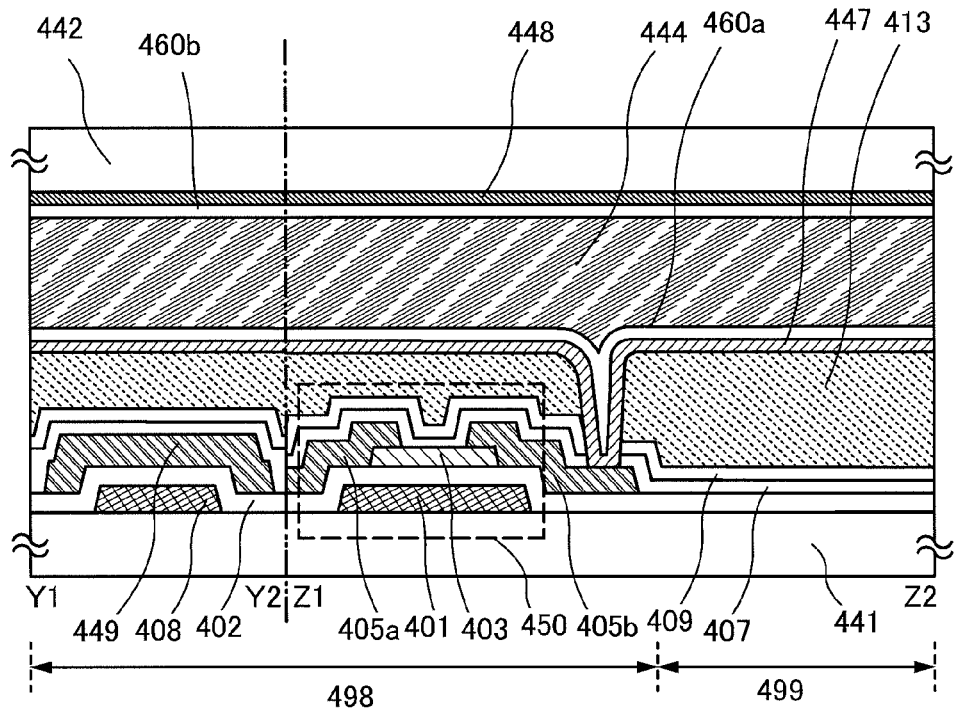
FIG. 11B is a cross-sectional view used to describe one embodiment of the present invention.

FIG. 11A is a plan view of one pixel in the display panel. FIG. 11B is a cross-sectional view taken along lines Y1-Y2 and Z1-Z2 shown in FIG. 11A.

In FIG. 11A, a plurality of source line layers (including a source electrode layer 405a or a drain electrode layer 405b) are arranged in parallel (is extended in the vertical direction in the drawing) to be spaced from each other. A plurality of gate line layers (including a gate electrode layer 401) is formed to be extended in a direction generally perpendicular to the source line layers (the horizontal direction in the drawing) and to be spaced from each other. Capacity line layers 408 are placed so as to be adjacent to the plurality of gate line layers and are extended in a direction generally parallel to the gate line layers, that is, in a direction generally perpendicular to the source line layers (in the horizontal direction in the drawing).

In the liquid crystal display device shown in FIGS. 11A and 11B, a transparent electrode layer 447 is formed as a pixel electrode layer. An insulating layers 407 and 409, and an interlayer film 413 are formed over a transistor 450. The transparent electrode layer 447 is electrically connected to the transistor 450 through an opening (a contact hole) formed in the insulating layers 407 and 409, and the interlayer film 413.

As shown in FIG. 11B, a common electrode layer 448 (also referred to as a counter electrode layer) is formed on a second substrate 442 and faces the transparent electrode layer 447 over a first substrate 441 with a liquid crystal layer 444 therebetween. Note that in FIGS. 11A and 11B, an alignment film 460a is formed between the transparent electrode layer 447 and the liquid crystal layer 444. An alignment film 460b is formed between the common electrode layer 448 and the liquid crystal layer 444. The alignment films 460a and 460b are insulating layers having a function of controlling the alignment of liquid crystal and thus are not necessarily formed depending on a material for the liquid crystal.

The transistor 450 is an example of a bottom-gate inverted-staggered transistor and includes a gate electrode layer 401, a gate insulating layer 402, an oxide semiconductor layer 403, the source electrode layer 405a, and the drain electrode layer 405b. In addition, the capacity line layer 408 which is formed in the same step as the gate electrode layer 401, the gate insulating layer 402, and a conductive layer 449 which is formed in the same step as the source electrode layer 405a or the drain electrode layer 405b are stacked to form a capacitor.

Embodiment 4 can be implemented in appropriate combination with the structures described in the other embodiments.

Embodiment 5

In Embodiment 5, an example of a transistor that can be applied to a liquid crystal display device disclosed in this specification will be described. There is no particular limitation on a structure of the transistor that can be applied to the liquid crystal display device disclosed in this specification. For example, a staggered transistor, a planar transistor, or the like having a top-gate structure in which a gate electrode is placed on an upper side of an oxide semiconductor layer with a gate insulating layer interposed or a bottom-gate structure in which a gate electrode is placed on a lower side of an oxide semiconductor layer with a gate insulating layer interposed, can be used. The transistor may have a single gate structure including one channel formation region, a double gate structure including two channel formation regions, or a triple gate structure including three channel formation regions. Alternatively, the transistor may have a dual gate structure including two gate electrode layers placed over and below a channel region with a gate insulating layer interposed. FIGS. 12A to 12D each show an example of the cross-sectional structure of a transistor. Each of the transistors shown in FIGS. 12A to 12D uses an oxide semiconductor in its semiconductor layer. An advantage of using an oxide semiconductor is that a high field-effect mobility (the maximum value is 5 cm$^2$/Vsec or more, preferably in the range of 10 cm$^2$/Vsec to 150 cm$^2$/Vsec) can be obtained when a transistor is on, and a low off-state current per unit channel width (e.g., less than 1 aA/μm, preferably less than 10 zA/μm and less than 100 zA/μm at 85° C. per unit channel width) can be obtained when the transistor is off.

Figure 12A:
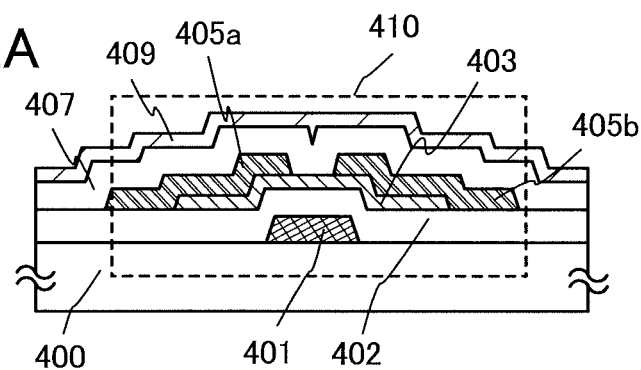
FIGS. 12A to 12D are cross-sectional views used to describe one embodiment of the present invention.

A transistor 410 shown in FIG. 12A is a bottom-gate transistor and is also referred to as an inverted staggered transistor.

The transistor 410 includes, over a substrate 400 having an insulating surface, a gate electrode layer 401, a gate insulating layer 402, an oxide semiconductor layer 403, a source electrode layer 405a, and a drain electrode layer 405b. An insulating film 407 is formed to cover the transistor 410 and to be stacked over the oxide semiconductor layer 403. Further, a protective insulating layer 409 is formed over the insulating film 407.

Figure 12B:
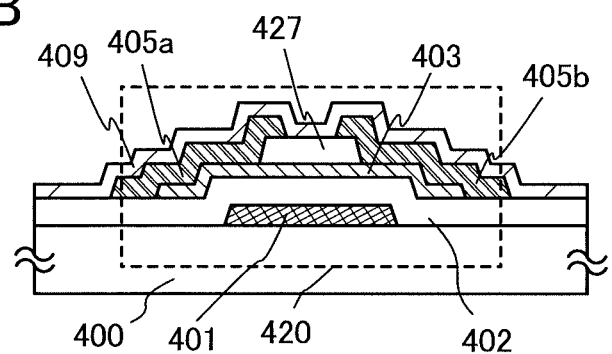

A transistor 420 shown in FIG. 12B is a bottom-gate transistor referred to as a channel-protective type (also referred to as a channel-stop type) transistor and is also referred to as an inverted staggered transistor.

The transistor 420 includes, over the substrate 400 having an insulating surface, the gate electrode layer 401, the gate insulating layer 402, the oxide semiconductor layer 403, an insulating layer 427 functioning as a channel protective layer covering a channel formation region of the oxide semiconductor layer 403, the source electrode layer 405a, and the drain electrode layer 405b. Further, the protective insulating layer 409 is formed to cover the transistor 420.

Figure 12C:
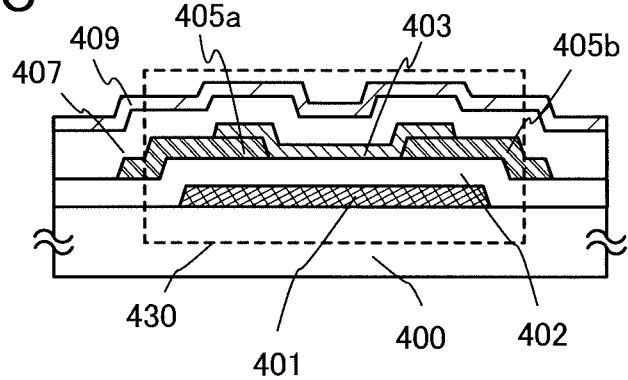

A transistor 430 shown in FIG. 12C is a bottom-gate transistor and includes, over the substrate 400 having an insulating surface, the gate electrode layer 401, the gate insulating layer 402, the source electrode layer 405a, the drain electrode layer 405b, and the oxide semiconductor layer 403. The insulating film 407 is formed to cover the transistor 430 and to be in contact with the oxide semiconductor layer 403. Further, the protective insulating layer 409 is formed over the insulating film 407.

In the transistor 430, the gate insulating layer 402 is formed over and in contact with the substrate 400 and the gate electrode layer 401; the source electrode layer 405a and the drain electrode layer 405b are formed over and in contact with the gate insulating layer 402. The oxide semiconductor layer 403 is formed over the gate insulating layer 402, the source electrode layer 405a, and the drain electrode layer 405b.

Figure 12D:
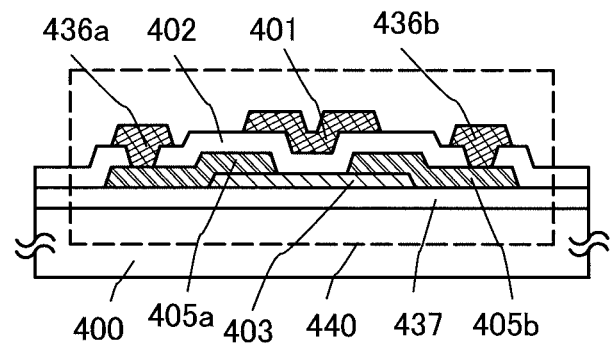

A transistor 440 shown in FIG. 12D is a top-gate transistor. The transistor 440 includes, over the substrate 400 having an insulating surface, an insulating layer 437, the oxide semiconductor layer 403, the source electrode layer 405a, the drain electrode layer 405b, the gate insulating layer 402, and the gate electrode layer 401. A wiring layer 436a and a wiring layer 436b are formed in contact with and are electrically connected to the source electrode layer 405a and the drain electrode layer 405b respectively.

In Embodiment 5, the oxide semiconductor layer 403 is used as a semiconductor layer as described above. Examples of an oxide semiconductor used for the oxide semiconductor layer 403 include: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; and a single-component metal oxide such as an In—O-based oxide semiconductor, a Sn—O-based oxide semiconductor, and a Zn—O-based oxide semiconductor. In addition, SiO$_2$ may be contained in the above oxide semiconductor. Here, for example, an In—Ga—Zn—O-based oxide semiconductor means an oxide film containing indium (In), gallium (Ga), and zinc (Zn), and there is no particular limitation on the stoichiometric proportion thereof. The In—Ga—Zn—O-based oxide semiconductor may contain an element other than In, Ga, and Zn.

As the oxide semiconductor layer 403, a thin film expressed by a chemical formula of 1 nMO$_3$(ZnO)$_m$ (in >0) can be used. Here, M represents one or more metal elements selected from Ga, Al, Mn, and Co. For example, M can be Ga, Ga and Al, Ga and Mn, Ga and Co, or the like.

In each of the transistors 410, 420, 430, and 440 using the oxide semiconductor layer 403, the value of current in a transistor in the off state (off-state current value) can be reduced. Therefore, a capacitor for holding an electric signal such as an image signal can be designed to be small in a pixel. This enables improvement in the aperture ratio of a pixel, thereby achieving low power consumption corresponding to the improvement.

Further, since the off-state current of the transistors 410, 420, 430, and 440 using the oxide semiconductor layer 403 can be reduced, in the pixel, a holding time of an electric signal such as an image signal can be made longer and the interval of a write period can be set longer. Therefore, the cycle of one frame period can be made longer, and the frequency of refresh operations performed in a still-image display period can be reduced, thereby further enhancing the effect of suppressing power consumption. In addition, since the transistors can be separately formed in a driver circuit area and a pixel area over one substrate, the number of the components of the liquid crystal display device can be reduced.

There is no limitation on a substrate that can be applied to the substrate 400 having an insulating surface. For example, a glass substrate such as a glass substrate made of barium borosilicate glass or aluminosilicate glass can be used.

In the bottom-gate transistors 410, 420, and 430, an insulating film serving as a base film may be formed between the substrate and the gate electrode layer. The base film has a function of preventing diffusion of an impurity element from the substrate, and can be a single layer or a stack of a silicon nitride film, a silicon oxide film, a silicon nitride oxide film, or a silicon oxynitride film.

The gate electrode layer 401 can be a single layer or stack of any of the following materials: metal materials such as molybdenum, titanium, chromium, tantalum, tungsten, aluminum, copper, neodymium, and scandium; and alloy materials containing any of these materials as their main component.

The gate insulating layer 402 can be a single layer or a stack of any of the following: a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer, and can be formed by plasma CVD, sputtering, or the like. For example, a 200-nm-thick gate insulating layer is formed in such a manner that a first gate insulating layer that is a silicon nitride layer (SiN$_y$ (y>0)) having a thickness of 50 nm to 200 nm is formed by plasma CVD and then a second gate insulating layer that is a silicon oxide layer (SiO$_x$ (x>0)) having a thickness of 5 nm to 300 nm is stacked over the first gate insulating layer.

As a conductive film used for the source electrode layer 405a and the drain electrode layer 405b, for example, a metal film containing an element selected from Al, Cr, Cu, Ta, Ti, Mo, and W and a metal nitride film containing any of the above elements as its main component (a titanium nitride film, a molybdenum nitride film, a tungsten nitride film, or the like) can be used. A metal film having a high melting point such as Ti, Mo, W, or the like or a metal nitride film of any of these elements (a titanium nitride film, a molybdenum nitride film, and a tungsten nitride film) may be stacked on one or both of a lower side or an upper side of a metal film of Al, Cu, or the like.

The same material as that of the source electrode layer 405a and the drain electrode layer 405b can be also used for conductive films used as the wiring layer 436a and the wiring layer 436b which are connected to the source electrode layer 405a and the drain electrode layer 405b respectively.

The conductive film to be the source electrode layer 405a and the drain electrode layer 405b (including a wiring layer formed using the same layer as the source electrode layer 405a and the drain electrode layer 405b) may be formed using conductive metal oxide. As the conductive metal oxide, indium oxide (In$_2$O$_3$), tin oxide (SnO$_2$), zinc oxide (ZnO), an alloy of indium oxide and tin oxide (In$_2$O$_3$—SnO$_2$, referred to as ITO), an alloy of indium oxide and zinc oxide (In$_2$O$_3$—ZnO), and such a metal oxide material containing silicon oxide can be used.

As the insulating films 407 and 427 being formed over the oxide semiconductor layer and as the insulating film 437 being formed below the oxide semiconductor layer, an inorganic insulating film such as a silicon oxide film, a silicon oxynitride film, an aluminum oxide film, or an aluminum oxynitride film can be typically used.

For the protective insulating layer 409 formed over the oxide semiconductor layer, an inorganic insulating film such as a silicon nitride film, an aluminum nitride film, a silicon nitride oxide film, or an aluminum nitride oxide film can be used.

Further, a planarization insulating film may be formed over the protective insulating layer 409 so that surface roughness due to the transistor is reduced. As the planarization insulating film, an organic material such as polyimide, an acrylic resin, and a benzocyclobutene-based resin can be used. In addition to the above organic materials, a low-dielectric constant material (a low-k material) or the like can be used. Note that the planarization insulating film may be formed by stacking a plurality of insulating films of any of these materials.

As described above, the off-state current of a transistor having an oxide semiconductor layer formed according to Embodiment 5 can be made low. Consequently, in the pixel, a holding time of an electric signal such as an image signal can be made longer and the interval of a write period can be set longer. Therefore, the cycle of one frame period can be made longer, and the frequency of refresh operations performed in a still-image display period can be reduced, thereby further enhancing the effect of suppressing power consumption. An oxide semiconductor layer is preferable in that it can be formed without a process such as laser irradiation and allows a transistor to be formed on a large-scale substrate.

Embodiment 5 can be implemented in appropriate combination with the structures described in the other embodiments.

Embodiment 6

In Embodiment 6, examples of a transistor including an oxide semiconductor layer and the manufacturing method thereof will be described in detail below with reference to FIGS. 13A to 13E. The same portion as or a portion having a function similar to those in Embodiment 5 and repetitive description will be omitted. In addition, detailed description of the same portions is not repeated.

FIGS. 13A to 13E show an example of a cross-sectional structure of a transistor. A transistor 510 shown in FIGS. 13A to 13E is a bottom-gate inverted staggered transistor, which is similar to the transistor 410 shown in FIG. 12A.

A process of forming the transistor 510 over a substrate 505 will be described with reference to FIGS. 13A to 13E.

First, a conductive film is formed over the substrate 505 having an insulating surface, and then, a gate electrode layer 511 is formed through a first photolithography step. Note that a resist mask may be formed by an inkjet method. Formation of the resist mask by an inkjet method needs no photomask; thus, manufacturing cost can be reduced.

As the substrate 505 having an insulating surface, a substrate similar to the substrate 400 described in Embodiment 4 can be used. In Embodiment 6, a glass substrate is used as the substrate 505.

An insulating film serving as a base film may be formed between the substrate 505 and the gate electrode layer 511. The base film has a function of preventing diffusion of an impurity element from the substrate 505, and can be a single layer or a stack of a silicon nitride film, a silicon oxide film, a silicon nitride oxide film, and a silicon oxynitride film.

The gate electrode layer 511 can be a single layer or a stack of any of the following materials: metal materials such as molybdenum, titanium, tantalum, tungsten, aluminum, copper, neodymium, and scandium; and alloy materials including any of these metal materials as its main component.

Next, a gate insulating layer 507 is formed over the gate electrode layer 511. The gate insulating layer 507 can be formed by plasma-enhanced CVD, sputtering, or the like to be a single layer or a stack of any of the following layers: a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer.

An oxide semiconductor made to be an i-type semiconductor or a substantially i-type semiconductor by removing an impurity is used as the oxide semiconductor of Embodiment 6. Such a highly purified oxide semiconductor is highly sensitive to an interface state and interface charges; thus, an interface between the oxide semiconductor layer and the gate insulating layer is important. For this reason, the gate insulating layer that is to be in contact with a highly purified oxide semiconductor needs to have a high quality.

For example, high-density plasma-enhanced CVD using microwaves (e.g., with a frequency of 2.45 GHz) is preferable in that it makes a dense insulating layer having a high withstand voltage and high quality. This is because putting the highly purified oxide semiconductor in close contact with the high-quality gate insulating layer reduces the interface state density and makes interface characteristics favorable.

Needless to say, another film formation method such as sputtering or plasma-enhanced CVD can be employed as long as it forms a high-quality insulating layer as a gate insulating layer. Alternatively, a film formation method can be employed as long as it forms an insulating layer to be a gate insulating layer in which its film quality and the characteristics of its interface to an oxide semiconductor are improved by heat treatment performed after the formation of the insulating layer. In any case, any film formation method can be employed as long as it forms an insulating layer that has, of course, favorable characteristics of a gate insulating layer and reduces the interface state density of its interface to an oxide semiconductor thereby forming a favorable interface.

In order for the gate insulating layer 507 and an oxide semiconductor film 530 to contain hydrogen, a hydroxyl group, and moisture as little as possible, it is preferable to perform pretreatment before the formation of the oxide semiconductor film 530. As the pretreatment, the substrate 505 provided with the gate electrode layer 511 or a substrate 505 over which the gate electrode layer 511 and the gate insulating layer 507 are formed is preheated in a preheating chamber of a sputtering apparatus, thereby removing and evacuating an impurity such as hydrogen or moisture adsorbed on the substrate 505. A cryopump is preferably used as an evacuation unit in the preheating chamber. Note that this preheating treatment can be omitted. Further, this preheating treatment may be performed in a similar manner on the substrate 505 over which a source electrode layer 515a and a drain electrode layer 515b have been formed and an insulating layer 516 has not been formed yet.

Figure 13A:
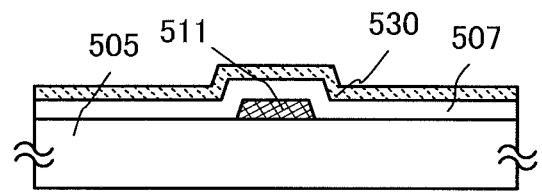
FIGS. 13A to 13E are cross-sectional views used to describe one embodiment of the present invention.
Figure 13B:
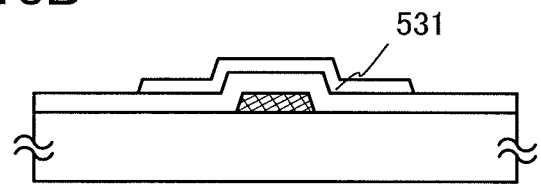
Figure 13C:
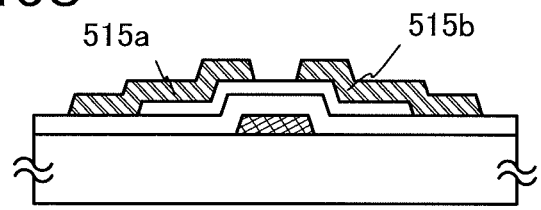

Next, the oxide semiconductor film 530 having a thickness ranging from 2 nm to 200 nm, preferably from 5 nm to 30 nm is formed over the gate insulating layer 507 (see FIG. 13A).

Note that before the oxide semiconductor film 530 is formed by sputtering, powder substances (also referred to as particles or dust) which attach on a surface of the gate insulating layer 507 are preferably removed by reverse sputtering in which an argon gas is introduced and plasma is generated. The reverse sputtering refers to a method in which, without applying a voltage to a target side, an RF power source is used for application of a voltage to a substrate in an argon atmosphere to generate plasma in the vicinity of the substrate side to modify a surface. Note that instead of an argon atmosphere, a nitrogen atmosphere, a helium atmosphere, an oxygen atmosphere, or the like may be used.

The oxide semiconductor described in Embodiment 5 can be used as an oxide semiconductor for the oxide semiconductor film 530. Further, $SiO_2$ may be contained in the above oxide semiconductor. In Embodiment 6, the oxide semiconductor film 530 is formed by sputtering using an In—Ga—Zn—O-based oxide target. A cross-sectional view at this stage is shown in FIG. 13A. Alternatively, the oxide semiconductor film 530 can be formed by sputtering in a rare gas (typically argon) atmosphere, an oxygen atmosphere, or a mixed atmosphere containing a rare gas and oxygen.

The target used for the formation of the oxide semiconductor film 530 by sputtering is, for example, an oxide target containing $In_2O_3$, $Ga_2O_3$, and ZnO at a composition ratio of 1:1:1 [molar ratio], so that an In—Ga—Zn—O film is formed. Without limitation to the material and the component of the target, for example, an oxide target containing $In_2O_3$, $Ga_2O_3$, and ZnO at 1:1:2 [molar ratio] may be used.

The filling factor of the oxide target is 90% to 100%, preferably 95% to 99.9%. By using the metal oxide target with high filling factor, a dense oxide semiconductor film can be formed.

It is preferable that a high-purity gas from which an impurity such as hydrogen, water, a hydroxyl group, or a hydride is removed be used as a sputtering gas used to form the oxide semiconductor film 530.

The substrate is held in a film formation chamber kept under reduced pressure, and the substrate temperature ranges from 100° C. to 600° C., preferably from 200° C. to 400° C. Forming the oxide semiconductor film while heating the substrate at the same time reduces the concentration of impurities included in a formed oxide semiconductor film and reduces damage due to sputtering. Then, a sputtering gas from which hydrogen and moisture are removed is introduced into the film formation chamber where remaining moisture has been removed, and the oxide semiconductor film 530 is formed over the substrate 505 with the use of the above target. In order to remove remaining moisture from the film formation chamber, an entrapment vacuum pump such as a cryopump, an ion pump, or a titanium sublimation pump is preferably used. The evacuation unit may be a turbo pump provided with a cold trap. In the film formation chamber evacuated with use of the cryopump, a hydrogen atom, a compound including a hydrogen atom, such as water ($H_2O$) (more preferably, also a compound including a carbon atom), and the like are removed, thereby reducing the concentration of impurities in the oxide semiconductor film faulted in the film formation chamber.

An example of the film formation condition is as follows: the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that the use of a pulse direct current power source is preferable in that it reduces powder substances (also referred to as particles or dust) generated at the time of the film formation and makes the film thickness uniform.

Then, through a second photolithography step, the oxide semiconductor film 530 is processed into an island-shaped oxide semiconductor layer. A resist mask for forming the island-shaped oxide semiconductor layer may be formed by an ink-jet method. Forming the resist mask by an inkjet method needs no photomask and thus reduces manufacturing cost.

In the case where a contact hole is formed in the gate insulating layer 507, a step of forming the contact hole can be performed at the same time as a step of processing the oxide semiconductor film 530.

Note that the etching of the oxide semiconductor film 530 may be dry etching, wet etching, or both dry etching and wet etching. As an etchant used for wet etching of the oxide semiconductor film 530, a mixed solution of phosphoric acid, acetic acid, and nitric acid; or ITO07N (produced by KANTO CHEMICAL CO., INC.) can be used for example.

Next, the oxide semiconductor layer is subjected to first heat treatment. By this first heat treatment, the oxide semiconductor layer can be dehydrated or dehydrogenated. The temperature of the first heat treatment ranges from 400° C. to 750° C., or is 400° C. or more and less than the strain point of the substrate. Here, an oxide semiconductor layer 531 is formed in the following manner the substrate is introduced into an electric furnace, which is a heat treatment apparatus, and heat treatment is performed on the oxide semiconductor layer in a nitrogen atmosphere at 450° C. for one hour; after that, the oxide semiconductor layer is prevented from being exposed to the air so that entry of water and hydrogen into the oxide semiconductor layer is prevented (see FIG. 13B).

A heat treatment apparatus used in this step is not limited to an electric furnace, and may be a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp A GRTA apparatus is an apparatus for heat treatment using a high-temperature gas. An inert gas that does not react with an object to be processed by heat treatment, such as nitrogen or a rare gas like argon, is used as the high temperature gas.

For example, as the first heat treatment, GRTA may be performed in the following manner: the substrate is transferred and put into an inert gas heated to high temperatures in the range of 650° C. to 700° C., heated for several minutes, and taken out from the inert gas heated to high temperatures.

Note that in the first heat treatment, it is preferable that water, hydrogen, and the like be not contained in the atmosphere of nitrogen or a rare gas such as helium, neon, or argon. The purity of nitrogen or the rare gas such as helium, neon, or argon which is introduced into the heat treatment apparatus is preferably 6N (99.9999%) or more, preferably 7N (99.99999%) or more (i.e., the impurity concentration is preferably 1 ppm or less, preferably 0.1 ppm or less).

After the oxide semiconductor layer is heated by the first heat treatment, a high-purity oxygen gas, a high-purity $N_2O$ gas, or ultra-dry air (having a dew point of −40° C. or less, preferably −60° C. or less) may be introduced into the same furnace. It is preferable that water, hydrogen, or the like be not contained in the oxygen gas or the $N_2O$ gas. Alternatively, the purity of an oxygen gas or an $N_2O$ gas which is introduced into the heat treatment apparatus is preferably 6N or more, more preferably 7N or more (i.e., the impurity concentration of the oxygen gas or the $N_2O$ gas is 1 ppm or less, preferably 0.1 ppm or less). Although oxygen which is a main component included in the oxide semiconductor is reduced through the elimination of impurities by performance of dehydration treatment or dehydrogenation treatment, oxygen is supplied by the effect of introduction of the oxygen gas or the $N_2O$ gas in the above manner, so that the oxide semiconductor layer is highly purified and made to be an electrically i-type (intrinsic) semiconductor.

Alternatively, the first heat treatment of the oxide semiconductor layer can be performed on the oxide semiconductor film 530 which has not yet been processed into the island-shaped oxide semiconductor layer. In that case, the substrate is taken out from the heat apparatus after the first heat treatment, and then a photolithography step is performed.

Alternatively, the first heat treatment may be performed either after a source electrode layer and a drain electrode layer are formed over the oxide semiconductor layer or after an insulating layer is formed over the source electrode layer and the drain electrode layer, as long as the first heat treatment is performed after the formation of the oxide semiconductor layer.

In the case where a contact hole is formed in the gate insulating layer 507, the formation of the contact hole may be performed before or after the first heat treatment is performed on the oxide semiconductor film 530.

Alternatively, an oxide semiconductor layer may be formed through two film formation steps and two heat treatment steps. The thus formed oxide semiconductor layer has a thick crystalline region (non-single-crystal region), that is, a region in which crystal grains are aligned in the c-axis direction (in the direction perpendicular to a surface of the layer), even when a base component includes any of an oxide, a nitride, a metal, or the like. For example, the oxide semiconductor layer having a thick crystalline region may be formed in the following manner a first oxide semiconductor film with a thickness of 3 nm to 15 nm is formed, and first heat treatment is performed in a nitrogen, oxygen, rare gas, or dry air atmosphere at 450° C. to 850° C., preferably 550° C. to 750° C., so that the first oxide semiconductor film has a crystalline region (including a plate-like crystal) including a surface thereof; then, a second oxide semiconductor film having a larger thickness than the first oxide semiconductor film is formed, and second heat treatment is performed at 450° C. to 850° C., preferably 600° C. to 700° C., so that crystal growth proceeds upward with the use of the first oxide semiconductor film as a seed of the crystal growth and the whole second oxide semiconductor film is crystallized.

Next, a conductive film to be the source and drain electrode layers (including a wiring formed in the same layer as the source and drain electrode layers) is formed over the gate insulating layer 507 and the oxide semiconductor layer 531.

The conductive film to be the source and drain electrode layers can be formed using the material which is used for the source electrode layer 405a and the drain electrode layer 405b described in Embodiment 5.

A resist mask is formed over the conductive film by a third photolithography step, and selective etching is performed so that the source electrode layer 515a and the drain electrode layer 515b are formed. Then, the resist mask is removed (see FIG. 13C).

Ultraviolet, KrF laser light, or ArF laser light is preferably used for light exposure for forming the resist mask in the third photolithography process. A channel length L of the transistor formed later is determined by the distance between the lower edge portion of the source electrode layer and the lower edge portion of the drain electrode layer facing each other over the oxide semiconductor layer 531. Note that when light exposure is preferably performed to provide the channel length L of less than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large depth of focus. For these reasons, the channel length L of the transistor to be formed later can be in the range of 10 nm to 1000 nm, and the circuit can operate at higher speed.

In order to reduce the number of the photomasks used in the photolithography process or the number of fabrication steps, etching process can be performed using a resist mask made by a multi-tone mask which is a light-exposure mask such that light transmitted by the mask has a plurality of intensities. A resist mask made by a multi-tone mask has a plurality of thicknesses and can be further changed in shape by etching; thus, such a resist mask can be used in a plurality of etching processes for different patterns. Thus, a resist mask applicable to at least two or more kinds of different patterns can be made by a single multi-tone mask. This reduces the number of exposure masks and also the number of corresponding photolithography processes, thereby simplifying the process.

Note that when the conductive film is etched, the optimum etching condition is desirably made so that the oxide semiconductor layer 531 can be prevented from being etched together with the conductive film and divided. However, it is difficult to attain such a condition that only the conductive film is etched and the oxide semiconductor layer 531 is not etched at all. In etching of the conductive film, the oxide semiconductor layer 531 is partly etched in some cases, thereby forming the oxide semiconductor layer having a groove portion (a depressed portion).

Next, by plasma treatment using a gas such as $N_2O$, $N_2$, or Ar, water or the like adsorbed on a surface of an exposed portion of the oxide semiconductor layer may be removed. In the case where the plasma treatment is performed, the insulating layer 516 which serves as a protective insulating film in contact with part of the oxide semiconductor layer is formed without exposure to the air.

The insulating layer 516 can be formed to a thickness of 1 nm or more by a method by which an impurity such as water or hydrogen does not enter the insulating layer 516, such as sputtering as appropriate. When hydrogen is contained in the insulating layer 516, the hydrogen enters the oxide semiconductor layer or extracts oxygen from the oxide semiconductor layer, which causes a reduction in the resistance of a back channel of the oxide semiconductor layer (i.e., makes an n-type back channel), so that a parasitic channel might be formed. Therefore, it is important not to use hydrogen for the film formation method in order for the insulating layer 516 to contain hydrogen as little as possible.

In this embodiment, a silicon oxide film is formed to a thickness of 200 nm as the insulating layer 516 by sputtering. The substrate temperature in film formation may be higher than or equal to room temperature and lower than or equal to 300° C. and in this embodiment, is 100° C. The silicon oxide film can be formed by sputtering in a rare gas (typically argon) atmosphere, an oxygen atmosphere, or a mixed atmosphere containing a rare gas and oxygen. As a target, a silicon oxide target or a silicon target may be used. For example, the silicon oxide film can be formed using a silicon target by sputtering in an atmosphere containing oxygen. As the insulating layer 516 which is formed in contact with the oxide semiconductor layer, an inorganic insulating film which does not include impurities such as moisture, a hydrogen ion, and OH⁻ and blocks entry of these from the outside is used; typically, a silicon oxide film, a silicon oxynitride film, an aluminum oxide film, an aluminum oxynitride film, or the like is used.

As in the case of formation of the oxide semiconductor film 530, an entrapment vacuum pump (such as a cryopump) is preferably used in order to remove remaining moisture in a film formation chamber used to form the insulating layer 516. When the insulating layer 516 is formed in the film formation chamber which is evacuated with use of a cryopump, the concentration of an impurity contained in the insulating layer 516 can be reduced. Alternatively, the evacuation unit used for removal of the remaining moisture in the film formation chamber used to form the insulating layer 516 may be a turbo pump provided with a cold trap.

It is preferable that a high-purity gas from which impurities such as hydrogen, water, a hydroxyl group, or a hydride are removed be used as a sputtering gas used to form the insulating layer 516.

Next, second heat treatment is performed in an inert gas atmosphere or an oxygen gas atmosphere (preferably at 200° C. to 400° C., e.g. 250° C. to 350° C.). For example, the second heat treatment is performed in a nitrogen atmosphere at 250° C. for one hour. The second heat treatment is performed in such a condition that part (a channel formation region) of the oxide semiconductor layer is in contact with the insulating layer 516.

Through the above process, the first heat treatment is performed on the oxide semiconductor film so that an impurity such as hydrogen, moisture, a hydroxyl group, or hydride (also referred to as a hydrogen compound) is removed from the oxide semiconductor layer, and oxygen which is one of main components of an oxide semiconductor and is reduced in the step of removing impurities can be supplied by the second heat treatment. Consequently, the oxide semiconductor layer is highly purified and is made to be an electrically i-type (intrinsic) semiconductor. Note that the hydrogen concentration in the highly-purified oxide semiconductor film is $5 \times 10^{19}$ atoms/cm³ or less, preferably $5 \times 10^{18}$ atoms/cm³ or less, more preferably $5 \times 10^{17}$ atoms/cm³ or less. Note that the above hydrogen concentration of the oxide semiconductor film is measured by secondary ion mass spectrometry (SIMS).

Figure 13D:
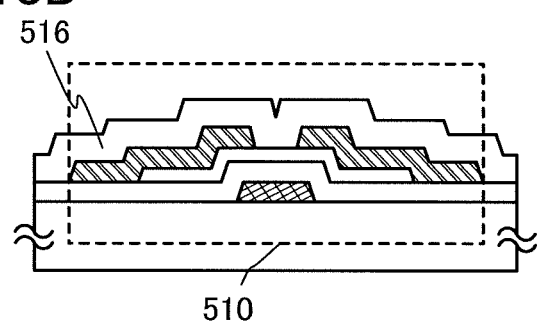
Figure 13E:
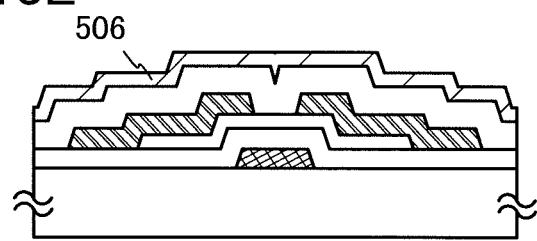

Through the above process, the transistor 510 is formed (see FIG. 13D).

When a silicon oxide layer having a lot of defects is used as the insulating layer 516, an impurity such as hydrogen, moisture, a hydroxyl group, or a hydride contained in the oxide semiconductor layer can be diffused into the insulating layer 516 by the heat treatment which is performed after the formation of the silicon oxide layer, so that impurities in the oxide semiconductor layer can be further reduced.

A protective insulating layer 506 may be formed over the insulating layer 516. For example, a silicon nitride film is formed by the RF sputtering method. The RF sputtering method gives good manufacturability, and thus is preferably used as a method for forming a protective insulating layer. As the protective insulating layer, an inorganic insulating film which does not include an impurity such as moisture and blocks entry of the impurity from the outside, e.g., a silicon nitride film, an aluminum nitride film, or the like is used. In Embodiment 6, the protective insulating layer 506 is formed using a silicon nitride film (see FIG. 13E).

In this embodiment, as the protective insulating layer 506, a silicon nitride film is formed by heating the substrate 505, over which the steps up to and including the formation step of the insulating layer 516 have been done, to 100° C. to 400° C., introducing a sputtering gas including high-purity nitrogen from which hydrogen and moisture are removed, and using a silicon semiconductor target. In that case also, it is preferable that remaining moisture be removed from a film formation chamber in the formation of the protective insulating layer 506 as in the case of the insulating layer 516.

After the formation of the protective insulating layer, heat treatment may be performed at 100° C. to 200° C. for 1 to 30 hours in an air atmosphere. This heat treatment may be performed at a fixed heating temperature. Alternatively, the following change in the heating temperature may be conducted more than once repeatedly. This heat treatment can be performed at a constant heating temperature or follow repeated temperature cycles where the temperature rises from room temperature to a heating temperature of 100° C. to 200° C. and drops from the a heating temperature to room temperature.

As described above, the off-state current of a transistor having a highly-purified oxide semiconductor layer formed in the manner of Embodiment 5 can be made low. Consequently, in the pixel, a holding time of an electric signal such as an image signal can be made longer and the interval of a write period can be set longer. Therefore, the cycle of one frame period can be made longer, and the frequency of refresh operations performed in a still-image display period can be reduced, thereby further enhancing the effect of suppressing power consumption. A highly-purified oxide semiconductor layer is preferable in that it can be formed without a process such as laser irradiation and allows a transistor to be formed on a large-scale substrate.

Embodiment 6 can be implemented in appropriate combination with the structures described in the other embodiments.

Embodiment 7

A liquid crystal display device disclosed in this specification can be applied to a variety of electronic devices (including a game machine). Examples of electronic appliances are a television set (also referred to as a television or a television receiver), a screen of a computer or the like, a camera such as a digital camera or a digital video camera, a digital photo frame, a cellular phone (also referred to as a cell phone or a mobile phone), a portable game console, a personal digital assistant, an audio reproducing device, a large-sized game machine such as a pachinko machine, and the like. Examples of an electronic device including the liquid crystal display device according to the above embodiments will be described.

Figure 14A:
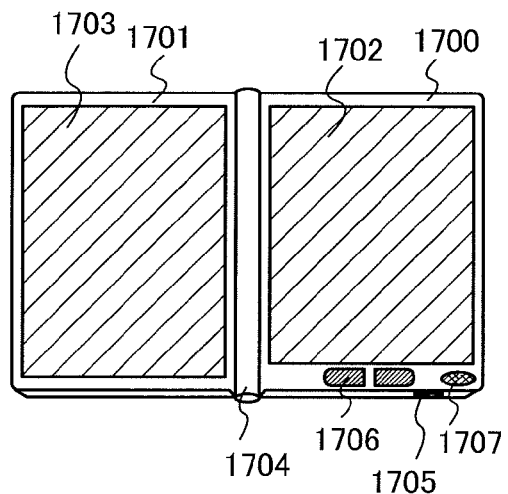
FIGS. 14A to 14D are diagrams used to describe electronic appliances according to one embodiment of the present invention.

FIG. 14A shows an example of an electronic book device. The electronic book device shown in FIG. 14A includes two housings, a housing 1700 and a housing 1701. The housing 1700 and the housing 1701 are combined with a hinge 1704 so that the electronic book device can be opened and closed. Such a structure allows the electronic book device to operate like a paper book.

A display area 1702 and a display area 1703 are incorporated in the housing 1700 and the housing 1701, respectively. The display area 1702 and the display area 1703 may be configured to display one image or different images. In the case where the display area 1702 and the display area 1703 display different images, the display area on the right side (the display area 1702 in FIG. 14A) can display text and the display area on the left side (the display area 1703 in FIG. 14A) can display graphics, for example.

FIG. 14A shows an example of the case where the housing 1700 is provided with an operation portion and the like. For example, the housing 1700 is provided with a power input terminal 1705, operation keys 1706, a speaker 1707, and the like. It is possible to turn the pages with the operation keys 1706. Note that a keyboard, a pointing device, or the like may be provided on the surface of the housing, on which the display area is provided. Further, an external connection terminal (an earphone terminal, a USB terminal, a terminal that can be connected to various cables such as a USB cable, or the like), a recording medium insert portion, or the like may be provided on the back surface or the side surface of the housing. Further, the electronic book device shown in FIG. 14A may serve as an electronic dictionary.

Figure 14B:
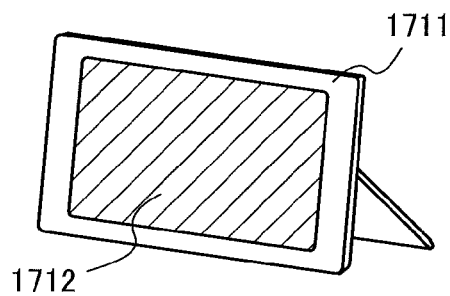

FIG. 14B shows an example of a digital photo frame using a liquid crystal display device. For example, in the digital photo frame shown in FIG. 14B, a display area 1712 is incorporated in a housing 1711. The display area 1712 can display various images. For example, the display area 1712 can display data of an image taken with a digital camera or the like and thus function as a normal photo frame.

Note that the digital photo frame shown in FIG. 14B is provided with an operation portion, an external connection terminal (a USB terminal, a terminal that can be connected to various cables such as a USB cable, or the like), a recording medium insertion portion, and the like. Although these components may be provided on the surface on which the display area is provided, it is preferable to provide them on the side surface or the back surface for the design of the digital photo frame. For example, a memory storing data of an image taken with a digital camera is inserted in the recording medium insertion portion of the digital photo frame, so that the image data can be transferred and then displayed on the display area 1712.

Figure 14C:
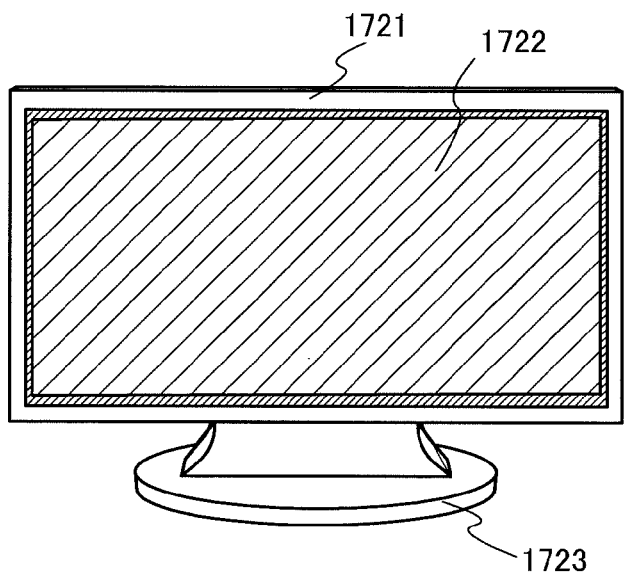

FIG. 14C shows an example of a television set using a liquid crystal display device. In the television set shown in FIG. 14C, a display area 1722 is incorporated in a housing 1721. The display area 1722 can display an image. Further, the housing 1721 is supported by a stand 1723 here. The liquid crystal display device according to the above embodiments can be applied to the display area 1722.

The television set shown in FIG. 14C can be operated with an operation switch of the housing 1721 or a separate remote control device. Channels and volume can be controlled with an operation key of the remote control device so that an image displayed on the display area 1722 can be controlled. Further, the remote control device may be provided with a display area for displaying data output from the remote control device.

Figure 14D:
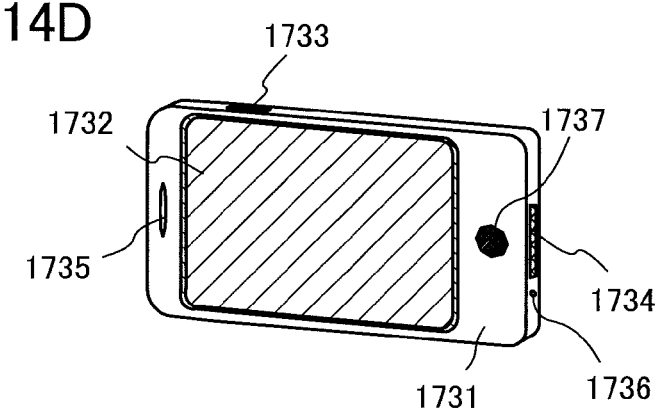

FIG. 14D shows an example of a cellular phone using a liquid crystal display device. The cellular phone shown in FIG. 14D is provided with a display area 1732 incorporated in a housing 1731, an operation button 1733, an operation button 1737, an external connection port 1734, a speaker 1735, a microphone 1736, and the like.

The display area 1732 of the cellular phone shown in FIG. 14D is a touchscreen. When the display area 1732 is touched with a finger or the like, contents displayed on the display area 1732 can be controlled. Further, operations such as making calls and texting can be performed by touching the display area 1732 with a finger or the like.

Embodiment 7 can be implemented in appropriate combination with the structures described in the other embodiments.

Embodiment 8

In Embodiment 8, the structure of the electronic book device according to Embodiment 7 will be described with a specific example.

Figure 15A:
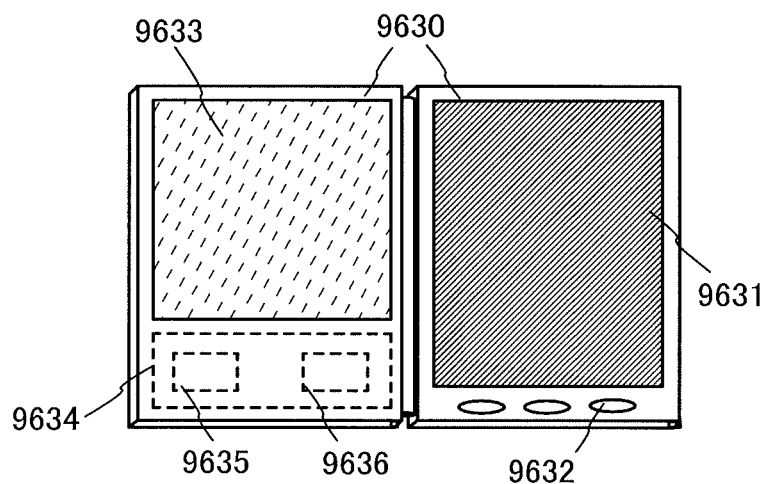
FIGS. 15A and 15B are diagrams used to describe an electronic book device according to one embodiment of the present invention.

FIG. 15A shows an electronic book device (also referred to as an e-book device), which includes housings 9630, a display area 9631, operation keys 9632, a solar cell 9633, and a charge and discharge control circuit 9634. The electronic book device shown in FIG. 15A has a function of displaying various kinds of information (e.g., a still image, a moving image, and a text image) on the display area; a function of displaying the calendar, date, time, or the like on the display area; a function of operating or editing the information displayed on the display area; a function of controlling processing by various kinds of software (programs); and the like. Note that in FIG. 15A, the charge and discharge control circuit 9634 has a battery 9635 and a DCDC converter (hereinafter abbreviated as a converter) 9636 as an example.

The structure shown in FIG. 15A is preferable in that it allows power generation by the solar cell 9633 and charge by the battery 9635 to be effectively performed. Providing the solar cell 9633 on a surface or a rear surface of the housing 9630 allows the battery 9635 to be charged more efficiently. Using a lithium ion battery as the battery 9635 provides advantages such as a reduction in size.

Figure 15B:
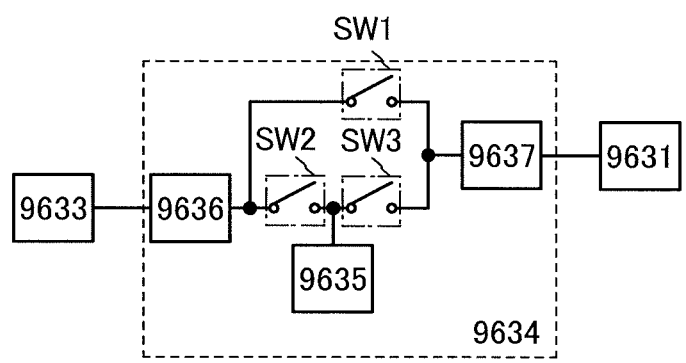

A configuration and operation of the charge and discharge control circuit 9634 shown in FIG. 15A is described with reference to a block diagram of FIG. 15B. FIG. 15B shows the solar cell 9633, the battery 9635, the converter 9636, the converter 9637, switches SW1 to SW3, and the display area 9631. The charge and discharge control circuit 9634 includes the battery 9635, the converter 9636, the converter 9637, and the switches SW1 to SW3.

First, explanation is given to an example of an operation performed in the case where the solar cell 9633 generates power with external light. The power generated by the solar cell is raised or lowered by the converter 9636 to a voltage for charging battery 9635. When the power from the solar cell 9633 is used to operate the display area 9631, the switch SW1 is turned on and the power is raised or lowered by the converter 9637 to a voltage needed for the display area 9631. When an image is not displayed on the display area 9631, the switch SW1 may be turned off and the switch SW2 may be turned on, thereby charging the battery 9635.

Next, explanation is given to an example of an operation performed in the case where the solar cell 9633 does not generate power with external light. The power stored in the battery 9635 is raised or lowered by the converter 9637 when the switch SW3 is turned on. Thus, the power from the battery 9635 is used to operate the display area 9631.

Note that although the solar cell 9633 has been shown as an example of a charging unit here, the battery 9635 may be charged by another unit. Alternatively, the battery 9635 may be charged by a combination of the solar cell 9633 and another charging unit.

Embodiment 8 can be implemented in appropriate combination with the structures described in the other embodiments.

Example 1

In Example 1, an example of how the off-state current of an example of a transistor is calculated with a leakage current measurement using a test element group (hereinafter called a TEG) will be described.

Figure 16:
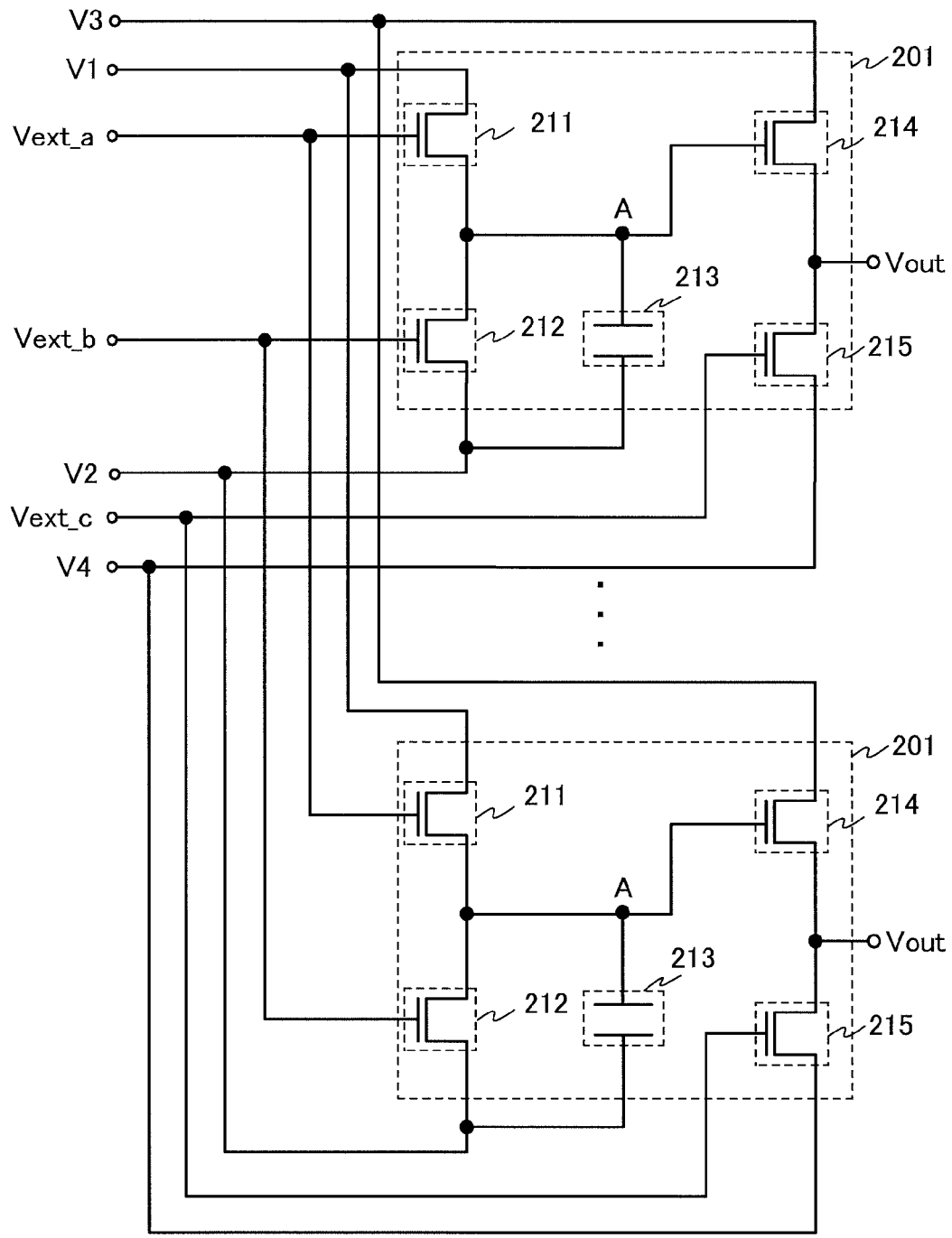
FIG. 16 is a circuit diagram used to describe Example 1.

The configuration of the TEG will be described with reference to FIG. 16. FIG. 16 is a circuit diagram showing the configuration of the TEG.

A TEG shown in FIG. 16 includes a plurality of systems of measurement 201. The plurality of systems of measurement 201 is connected in parallel. Here, as an example, eight systems of measurement 201 are connected in parallel.

Each system of measurement 201 includes a transistor 211, a transistor 212, a capacitor 213, a transistor 214, and a transistor 215.

A voltage V1 is input to a first terminal of the transistor 211. A voltage Vext_a is input to a gate of the transistor 211. The transistor 211 is a charge injecting transistor.

A first terminal of the transistor 212 is connected to a second terminal of the transistor 211. A voltage V2 is input to a second terminal of the transistor 212. A voltage Vext_b is input to a gate of the transistor 212. The transistor 212 is a leakage current evaluating transistor. Note that the leakage current here refers to a leakage current including the off-state current of a transistor.

A first electrode of the capacitor 213 is connected to the second terminal of the transistor 211. The voltage V2 is input to a second electrode of the capacitor 213. Here, 0 V is used as the voltage V2.

A voltage V3 is input to a first terminal of the transistor 214. A gate of the transistor 214 is connected to the second terminal of the transistor 211. Note that a connection point of the gate of the transistor 214, the second terminal of the transistor 211, the first terminal of the transistor 212, and the first electrode of the capacitor 213 is called a node A.

A first terminal of the transistor 215 is connected to a second terminal of the transistor 214. A voltage V4 is input to a second terminal of the transistor 215. A voltage Vext_c is input to a gate of the transistor 215. Note that here, 0.5 V is used as the voltage Vext_c.

In addition, each system of measurement 201 outputs the voltage of a connection point of the second terminal of the transistor 214 and the first terminal of the transistor 215, as an output voltage Vout.

Here, a transistor having a channel length L of 10 μm and a channel width W of 10 μm and having an oxide semiconductor layer is used as an example of the transistor 211. A transistor having a channel length L of 3 μm an and a channel width W of 100 μm and having an oxide semiconductor layer is used as an example of each of the transistor 214 and the transistor 215. A bottom-gate transistor with an oxide semiconductor layer; a source electrode and a drain electrode on the oxide semiconductor layer; and an off set region with a width of 1 μm, and without an overlap region of the source electrode and a gate electrode; and an overlap region of the drain electrode and the gate electrode is used as an example of the transistor 212. Providing the off set region can reduce parasitic capacitance. Six types of transistors, which are different in channel length L and channel width W, are used as the transistors 212 (see Table 1).

TABLE 1

|  | Channel length L[μm] | Channel width W [μm] |
|---|---|---|
| Type 1 | 1.5 | $1 \times 10^5$ |
| Type 2 | 3 | $1 \times 10^5$ |
| Type 3 | 10 | $1 \times 10^5$ |
| Type 4 | 1.5 | $1 \times 10^6$ |
| Type 5 | 3 | $1 \times 10^6$ |
| Type 6 | 10 | $1 \times 10^6$ |

By separately providing a charge injecting transistor and a leakage current evaluating transistor as shown in FIG. 16, the leakage current evaluating transistor can be kept off at the time of charge injection. When the charge injecting transistor is not provided, the leakage current evaluating transistor needs to be turned on at the time of charge injection. In this case, if the leakage current evaluating transistor is an element that requires long time to turn into a steady off-state from the on-state, the measurement requires long time.

In addition, by separately providing a charge injecting transistor and a leakage current evaluating transistor, each of these transistors can be of the proper size. Further, by making the channel width W of the leakage current evaluating transistor larger than that of the charge injecting transistor, the leakage current of the TEG except for the leakage current evaluating transistor can be made relatively low. As a result, the leakage current of the leakage current evaluating transistor can be measured with great accuracy. Further, the leakage current evaluating transistor does not need to be turned on at the time of charge injection, preventing the influence of fluctuations in the voltage of the node A caused by part of the charge in the channel formation region of the leakage current evaluating transistor flowing into the node A.

On the other hand, by making the channel width W of the charge injecting transistor smaller than that of the leakage current evaluating transistor, the leakage current of the charge injecting transistor can be made relatively low. Further, fluctuations in the voltage of the node A caused by part of the charge in the channel formation region of the leakage current evaluating transistor flowing into the node A at the time of charge injection are not influential.

In addition, by connecting the plurality of systems of measurement in parallel as shown in FIG. 16, the leakage current of the TEG can be calculated with greater accuracy.

Next, a method for calculating the off-state current of an example of the transistor of Example 1 with the use of the TEG shown in FIG. 16 will be described.

Figure 17:
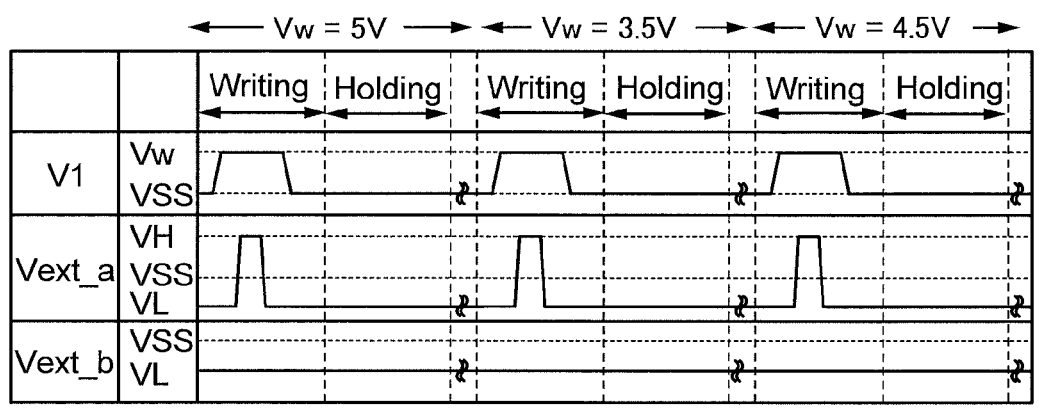
FIG. 17 is a timing diagram used to describe Example 1.

First, a method for calculating the leakage current of the TEG shown in FIG. 16 will be described with referent to FIG. 17. FIG. 17 is a timing diagram used to describe the method for calculating the leakage current of the TEG shown in FIG. 16.

In the method for calculating the leakage current with the use of the TEG shown in FIG. 16, a period is divided into a write period and a holding period. Operations performed in these periods will be described below.

First, in a write period, a voltage VL (−3 V) that turns off the transistor 212 is input as the voltage Vext_b. Further, a write voltage Vw is input as the voltage V1, and then a voltage VH (5 V) that keeps the transistor 211 on for a predetermined period is input as the voltage Vext_a. Consequently, charge is stored on the node A, so that the voltage of the node A becomes equivalent to the write voltage Vw. In the next step, the voltage VL that turns off the transistor 211 is input as the voltage Vext_a. Then, a voltage VSS (0 V) is input as the voltage V1.

In a subsequent holding period, the amount of change in the voltage of the node A caused by a change in the amount of charge stored on the node A is measured. A current flowing between a source electrode and a drain electrode of the transistor 212 can be calculated from the amount of change in the voltage. Thus, charge can be stored on the node A, and the amount of change in the voltage of the node A can be measured.

At that time, the storage of charge on the node A and the measurement of the amount of change in the voltage of the node A (also referred to as storage and measurement operation) are repeatedly performed. First, first storage and measurement operation is repeated 15 times. In the first storage and measurement operation, a voltage of 5 V is input as the write voltage Vw in a write period, and held for an hour in a holding period. Next, second storage and measurement operation are repeated twice. In the second storage and measurement operation, a voltage of 3.5 V is input as the write voltage Vw in a write period, and held for 50 hours in a holding period. Then, third storage and measurement operation is performed once. In the third storage and measurement operation, a voltage of 4.5 V is input as the write voltage Vw in a write period, and held for 10 hours in a holding period. It is possible to confirm if a measured current value is a value supposed to be obtained at the steady state by repeating the storage and measurement operations. In other words, it is possible to remove a transient (a current decreasing with time after the start of the measurement) from $I_A$ (current flowing through the node A). As a result, the leakage current can be measured with greater accuracy.

In general, $V_A$ (the voltage of the node A) can be measured as a function of Vout (output voltage) and expressed by the equation (1).

$$V_A = F(V\text{out}) \tag{1}$$

$Q_A$ (the electric charge stored on the node A) can be expressed by the equation (2) using $V_A$ (the voltage of the node A), $C_A$ (the capacitance of the capacitor connected to the node A), and a constant (const). Here, $C_A$ (the capacitance of the capacitor connected to the node A) is the sum of the capacitance of the capacitor 213 and capacitance except the capacitance of the capacitor 213 (e.g. the capacitance of the output circuit 103).

$$Q_A = C_A V_A + \text{const} \tag{2}$$

$I_A$ (current flowing through the node A) is the time derivatives of a charge flowing to the node A (or charge flowing from the node A), so that the $I_A$ (current flowing through the node A) is expressed by the equation (3).

$$I_A \equiv \frac{\Delta Q_A}{\Delta t} = \frac{C_A \cdot \Delta F(V\text{out})}{\Delta t} \tag{3}$$

Note that here, as an example, Δt is about 54000 sec. $I_A$ (current flowing through the node A) can be determined from $C_A$ (the capacitance of the capacitor connected to the node A) and Vout (output voltage) in this manner, so that the leakage current of the TEG can be determined.

Next, measurement results of the output voltage given by the measurement method using the TEG; and the leakage current of the TEG calculated from the measurement results will be shown.

Figure 18:
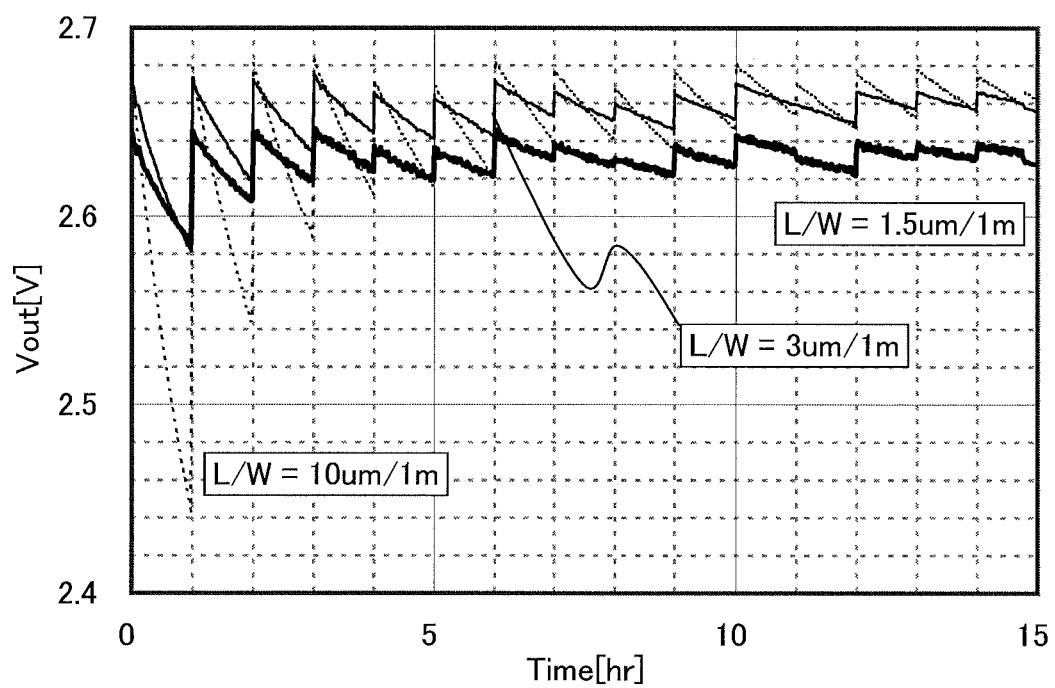
FIG. 18 is a relationship diagram used to describe Example 1.
Figure 19:
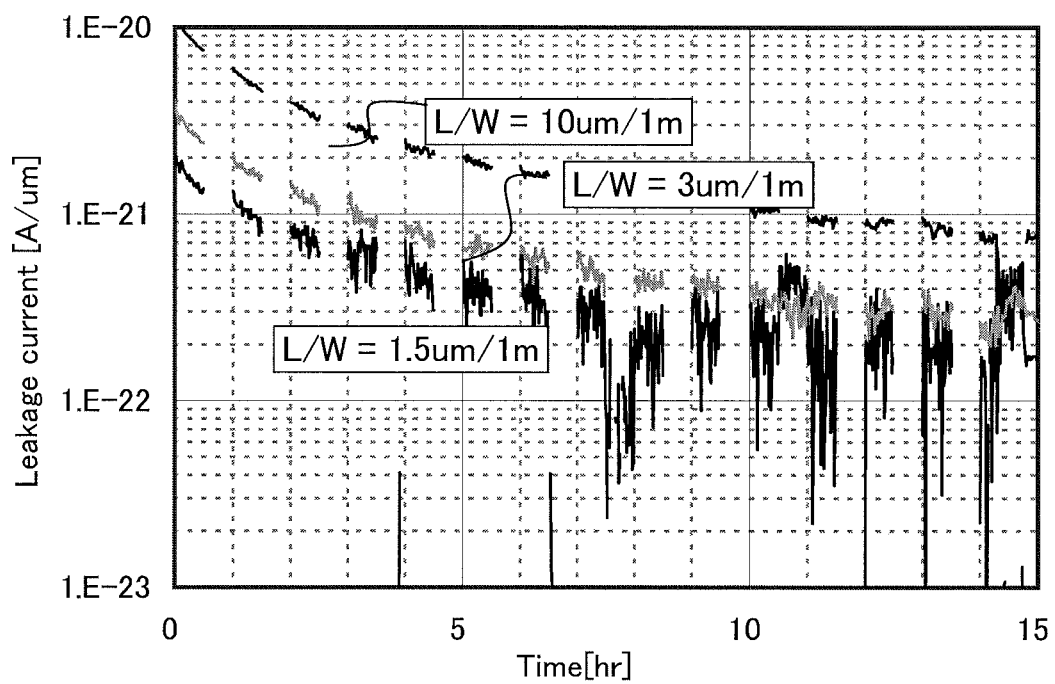
FIG. 19 is a relationship diagram used to describe Example 1.

FIG. 18 shows, as an example, a relation between elapsed time Time and Vout (output voltage) in the measurement (the first storage and measurement operation) with type 1, type 2, and type 3. FIG. 19 shows a relation between the elapsed time Time and the leakage current calculated by the measurement in the measurement. FIG. 18 shows that Vout (output voltage) fluctuates after the start of the measurement and 10 hours or more are needed for the transistors to go into the steady state.

Figure 20:
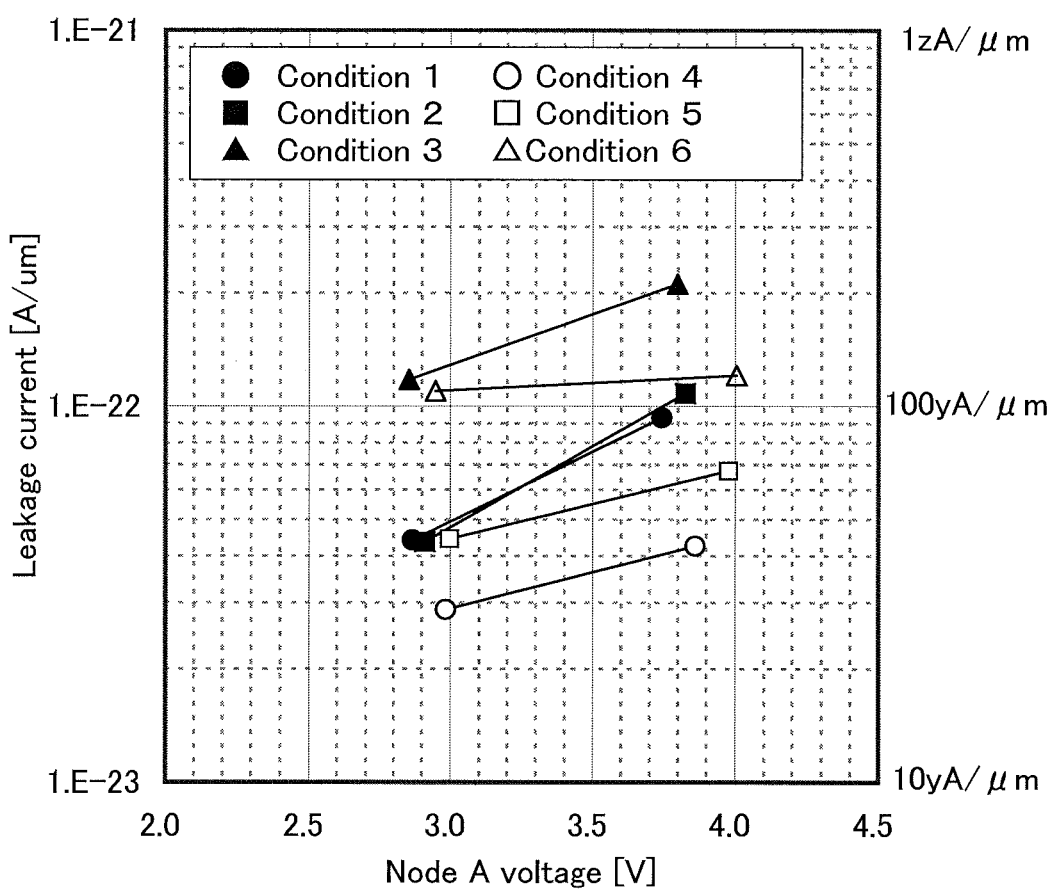
FIG. 20 is a relationship diagram used to describe Example 1.

FIG. 20 shows a relation between the voltage of the node A and the leakage current of Types 1 to 6, which relation is estimated by the measurement. In FIG. 20, in the case of Type 4 for example, the leakage current is 28 yA/μm when the voltage of the node A is 3.0 V. Since the off-state current of the transistor 212 is included in the leakage current, the off-state current of the transistor 212 can be also regarded as 28 yA/μm or less.

As described above, the leakage current of the TEG using a transistor having a highly-purified oxide semiconductor layer serving as a channel formation layer is sufficiently low, which means that the off-state current of the transistor is sufficiently low.

This application is based on Japanese Patent Application serial No. 2010-104032 filed with Japan Patent Office on Apr. 28, 2010, the entire contents of which is hereby incorporated by reference.

EXPLANATION OF REFERENCES

101: backlight area, 102: display panel, 103: polarizer plate, 104: polarizer plate, 106: diffuser plate, 107: pixel area, 108: scan line driver circuit, 109: signal line driver circuit, 110: pixel, 111: sub-pixel, 112: FPC, 113: external substrate, 115: circuit area, 120: liquid crystal display device, 121: display switch circuit, 122: display control circuit, 123: backlight area, 124: display panel, 125: image signal source, 143: write period, 144: holding period, 201: system of measurement, 211: transistor, 212: transistor, 213: capacitor, 214: transistor, 215: transistor, 300: external switch unit, 301: memory circuit, 302: comparator circuit, 303: selection circuit, 311: pixel area, 312: driver circuit, 313: sub-pixel, 322: backlight, 400: substrate, 401: gate electrode layer, 402: gate insulating layer, 403: oxide semiconductor layer, 407: insulating film, 408: capacity line layer, 409: protective insulating layer, 410: transistor, 413: interlayer film, 420: transistor, 427: insulating layer, 430: transistor, 437: insulating layer, 440: transistor, 441: substrate, 442: substrate, 444: liquid crystal layer, 447: transparent electrode layer, 448: common electrode layer, 449: conductive layer, 450: transistor, 505: substrate, 506: protective insulating layer, 507: gate insulating layer, 510: transistor, 511: gate electrode layer, 516: insulating layer, 530: oxide semiconductor film, 531: oxide semiconductor layer, 601: pixel area, 602: scan line, 603: signal line, 606: scan line driver circuit, 607: signal line driver circuit, 610: sub-pixel, 612: pixel transistor, 613: liquid crystal element, 614: capacitor, 618: common electrode, 619: capacity line, 710: image signal converter circuit, 711: display control switch circuit, 712: moving image display control circuit, 713: still image display control circuit, 714: moving image timing signal generator circuit, 715: moving image backlight control circuit, 716: still image timing signal generator circuit, 717: still image backlight control circuit, 801: period, 802: period, 830: pixel area, 831: display image, 840: backlight, 911: display image, 912: display image, 913: display image, 105B: light source, 105R: light source, 105G: light source, 105W: light source, 105Y: light source, 111B: sub-pixel, 111G: sub-pixel, 111R: sub-pixel, 111W: sub-pixel, 111Y: sub-pixel, 114B: light-transmitting area, 114G: light-transmitting area, 114R: light-transmitting area, 114W: light-transmitting area, 114Y: light-transmitting area, 1700: housing, 1701: housing, 1702: display area, 1703: display area, 1704: hinge, 1705: power input terminal, 1706: control key, 1707: speaker, 1711: housing, 1712: display area, 1721: housing, 1722: display area, 1723: stand, 1731: housing, 1732: display area, 1733: operation button, 1734: external connection port, 1735: speaker, 1736: microphone, 1737: operation button, 405a: source electrode layer, 405b: drain electrode layer, 436a: wiring layer, 436b: wiring layer, 460a: alignment film, 460b: alignment film, 515a: source electrode layer, 515b: drain electrode layer, 9630: housing, 9631: display area, 9632: control key, 9633: solar cell, 9634: charge and discharge control circuit, 9635: battery, 9636: converter, 9637: converter.

The invention claimed is:

1. A display device comprising:
    a first color light source and a second color light source;
    pixels configured to control transmission of light emitted by the first color light source and the second color light source, and comprising a first sub-pixel with a color filter and a second sub-pixel without a color filter configured to control only intensity of transmitted light;
    a display switch circuit configured to switch the display device between a moving image mode and a still image mode; and
    a display control circuit configured to control light transmittance of the pixels, luminance of the first color light source in the moving image mode, and luminance of the second color light source in the still image mode, in accordance with an image signal,
    wherein the first color light source is one of a red light source, a green light source and a blue light source,
    wherein the second color light source is one of a white light source and a yellow light source, and
    wherein the display control circuit is configured to turn off the first color light source and turn on the second color light source when the display switch circuit switches from the moving image mode to the still image mode.

2. The display device according to claim 1, wherein the pixels include liquid crystals.

3. The display device according to claim 1, the display control circuit further comprising:
    a moving image display control circuit configured to control light transmittance of the pixels and luminance of the first color light source in the moving image mode, in accordance with the image signal;
    a still image display control circuit configured to control light transmittance of the pixels and luminance of the second color light source in the still image mode, in accordance with the image signal; and
    a display control switch circuit configured to select one of the moving image display control circuit and the still image display control circuit in accordance with a switch signal outputted by the display switch circuit;
    wherein the display control switch circuit is configured to transmit the image signal to the selected one of the moving image display control circuit and the still image display control circuit.

4. The display device according to claim 3, the display control circuit further comprising:
    a moving image timing signal generator circuit configured to control the pixels so that the pixels can display an image based on the image signal in the moving image mode by using a plurality of write periods; and
    a still image timing signal generator circuit configured to control the pixels so that the pixels can display an image in the still image mode by using write periods and holding periods.

5. The display device according to claim 4, wherein the holding periods can last for one minute.

6. The display device according to claim 1, the display switch circuit further comprising:
- a memory circuit configured to store successive image signals; and
- a comparator circuit configured to judge whether the successive image signals are to display a moving image or a still image.

7. The display device according to claim 1, further comprising:
- an external switch unit configured to switch the display device between the moving image mode and the still image mode.

8. The display device according to claim 1, further comprising a signal line driver circuit and a scan line driver circuit,
- wherein the display device is configured to stop operation of the signal line driver circuit and the scan line driver circuit during a holding period.

9. The display device according to claim 1, wherein the first sub-pixel and the second sub-pixel each include an oxide semiconductor layer.

10. The display device according to claim 1, wherein the first color light source and the second color light source are light-emitting diodes.

11. An electronic appliance including the display device according to claim 1.

12. A liquid crystal display device comprising:
- a backlight area including first light sources of red light, green light and blue light, and second light sources of one of white light and yellow light;
- a display panel provided with pixels configured to control transmission of light emitted by the first light sources and the second light sources, and comprising a first sub-pixel with a red color filter, a second sub-pixel with a green color filter, a third sub-pixel with a blue color filter and a fourth sub-pixel without a color filter configured to control only intensity of transmitted light;
- a display switch circuit configured to switch the display panel between a moving image mode and a still image mode; and
- a display control circuit configured to control light transmittance of the pixels, luminance of the first light sources in the moving image mode, and luminance of the second light sources in the still image mode, in accordance with an image signal,
- wherein the display control circuit is configured to turn off the first light sources and turn on the second light sources when the display switch circuit switches from the moving image mode to the still image mode.

13. The liquid crystal display device according to claim 12, wherein the pixels include liquid crystals.

14. The liquid crystal display device according to claim 12, the display control circuit further comprising:
- a moving image display control circuit configured to control light transmittance of the pixels and luminance of the first light sources in the moving image mode, in accordance with the image signal;
- a still image display control circuit configured to control light transmittance of the pixels and luminance of the second light sources in the still image mode, in accordance with the image signal; and
- a display control switch circuit configured to select one of the moving image display control circuit and the still image display control circuit in accordance with a switch signal outputted by the display switch circuit;
- wherein the display control switch circuit is configured to transmit the image signal to the selected one of the moving image display control circuit and the still image display control circuit.

15. The liquid crystal display device according to claim 14, the display control circuit further comprising:
- a moving image timing signal generator circuit configured to control the pixels so that the pixels can display an image based on the image signal in the moving image mode by using a plurality of write periods; and
- a still image timing signal generator circuit configured to control the pixels so that the pixels can display an image in the still image mode by using write periods and holding periods.

16. The liquid crystal display device according to claim 15, wherein the holding periods can last for one minute.

17. The liquid crystal display device according to claim 12, the display switch circuit further comprising:
- a memory circuit configured to store successive image signals; and
- a comparator circuit configured to judge whether the successive image signals are to display a moving image or a still image.

18. The liquid crystal display device according to claim 12, further comprising:
- an external switch unit configured to switch the liquid crystal display device between the moving image mode and the still image mode.

19. The liquid crystal display device according to claim 12, further comprising a signal line driver circuit and a scan line driver circuit;
- wherein the liquid crystal display device is configured to stop operation of the signal line driver circuit and the scan line driver circuit during a holding period.

20. The liquid crystal display device according to claim 12, wherein the first to fourth sub-pixels each include an oxide semiconductor layer.

21. The liquid crystal display device according to claim 12, wherein the first light sources and the second light sources are light-emitting diodes.

22. An electronic appliance including the liquid crystal display device according to claim 12.

* * * * *